US012065604B2

United States Patent
Kwon et al.

(10) Patent No.: US 12,065,604 B2
(45) Date of Patent: Aug. 20, 2024

(54) QUANTUM DOT COMPOSITE, QUANTUM DOT, DEVICE INCLUDING THE SAME

(71) Applicant: SAMSUNG ELECTRONICS CO., LTD., Suwon-si (KR)

(72) Inventors: Soo Kyung Kwon, Suwon-si (KR); Yong Wook Kim, Yongin-si (KR); Ji-Yeong Kim, Suwon-si (KR); Seon-Yeong Kim, Suwon-si (KR); Sungwoo Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 316 days.

(21) Appl. No.: 17/502,645

(22) Filed: Oct. 15, 2021

(65) Prior Publication Data
US 2022/0119706 A1 Apr. 21, 2022

(30) Foreign Application Priority Data

Oct. 16, 2020 (KR) .................. 10-2020-0134707

(51) Int. Cl.
*C09K 11/02* (2006.01)
*C09K 11/88* (2006.01)
(Continued)

(52) U.S. Cl.
CPC ............ *C09K 11/883* (2013.01); *C09K 11/02* (2013.01); *G02F 1/133617* (2013.01);
(Continued)

(58) Field of Classification Search
CPC ....... C09K 11/02; C09K 11/883; B82Y 20/00; G02F 1/133617; H01L 51/502
See application file for complete search history.

(56) References Cited

U.S. PATENT DOCUMENTS 6,322,901 B1 11/2001 Bawendi et al.
6,861,155 B2 3/2005 Bawendi et al.
(Continued)

FOREIGN PATENT DOCUMENTS

CN 109401754 A 3/2019
JP 2019515338 A 6/2019
(Continued)

OTHER PUBLICATIONS

Sun-Hyoung Lee, Chang-Yeol Han, Seung-Won Song, Dae-Yeon Jo, Jung-Ho Jo, Suk-Young Yoon, Hyun-Min Kim, Seungki Hong, Jun Yeon Hwang, and Heesun Yang, ZnSeTe Quantum Dots as an Alternative to InP and Their High-Efficiency Electroluminescence, Chem. Mater. 2020, 32, 5768-5775 (Year: 2020).*

(Continued)

*Primary Examiner* — Bijan Ahvazi
(74) *Attorney, Agent, or Firm* — CANTOR COLBURN LLP

(57) ABSTRACT

A quantum dot composite that includes a matrix; and a plurality of quantum dots and titanium oxide particles dispersed in the matrix, wherein the quantum dots include zinc, tellurium, and selenium, the quantum dots do not comprise cadmium, lead, mercury, or a combination thereof, and in the quantum dot composite, a weight ratio of tellurium with respect to titanium is greater than or equal to about 1.5:1 and less than or equal to about 10:1.

21 Claims, 12 Drawing Sheets

(51) Int. Cl.
  *G02F 1/13357* (2006.01)
  *H01L 51/50* (2006.01)
  *H10K 50/115* (2023.01)
  *B82Y 20/00* (2011.01)
  *B82Y 40/00* (2011.01)

(52) U.S. Cl.
  CPC ............ *H10K 50/115* (2023.02); *B82Y 20/00* (2013.01); *B82Y 40/00* (2013.01)

(56) References Cited

U.S. PATENT DOCUMENTS

| | | | |
|---|---|---|---|
| 7,105,051 B2 | 9/2006 | Peng et al. | |
| 7,427,523 B2 | 9/2008 | Boardman et al. | |
| 8,035,772 B2 | 10/2011 | Kim et al. | |
| 8,436,964 B2 | 5/2013 | Kim et al. | |
| 9,082,982 B2 | 7/2015 | Jun et al. | |
| 9,606,281 B2 | 3/2017 | Jang et al. | |
| 9,933,658 B2 | 4/2018 | Jang et al. | |
| 10,619,096 B2 | 4/2020 | Park et al. | |
| 10,647,917 B2 | 5/2020 | Lee et al. | |
| 10,732,458 B2 | 8/2020 | Jang et al. | |
| 10,851,297 B2 | 12/2020 | Kim et al. | |
| 10,954,440 B2 | 3/2021 | Won et al. | |
| 2008/0138514 A1 | 6/2008 | Jang et al. | |
| 2010/0110728 A1 | 5/2010 | Dubrow et al. | |
| 2010/0283072 A1 | 11/2010 | Kazlas et al. | |
| 2012/0113671 A1 | 5/2012 | Sadasivan et al. | |
| 2012/0113672 A1 | 5/2012 | Dubrow et al. | |
| 2016/0161066 A1* | 6/2016 | Sung .................... C09K 11/703 252/301.36 | |
| 2017/0052444 A1 | 2/2017 | Park et al. | |
| 2018/0119007 A1 | 5/2018 | Ippen et al. | |
| 2020/0165517 A1 | 5/2020 | Lee et al. | |
| 2020/0174288 A1 | 6/2020 | Kim et al. | |
| 2020/0217974 A1 | 7/2020 | Park et al. | |
| 2020/0224094 A1 | 7/2020 | Won et al. | |
| 2021/0066543 A1* | 3/2021 | Han ........................ C09K 11/02 |

FOREIGN PATENT DOCUMENTS

| | | |
|---|---|---|
| KR | 1020070058072 A | 6/2007 |
| KR | 1020080093539 A | 10/2008 |
| KR | 1020140032811 A | 3/2014 |
| KR | 101460155 B1 | 11/2014 |
| KR | 101702000 B1 | 2/2017 |
| KR | 20190046248 A | 5/2019 |
| KR | 20190085886 A | 7/2019 |
| KR | 1020190085886 A | 7/2019 |
| KR | 20190106823 A | 9/2019 |
| KR | 20200006941 A | 1/2020 |
| KR | 20200062052 A | 6/2020 |
| KR | 20200064946 A | 6/2020 |
| KR | 20200087715 A | 7/2020 |

OTHER PUBLICATIONS

Eun-Pyo Jang, Chang-Yeol Han, Seung-Won Lim, Jung-Ho Jo, Dae-Yeon Jo, Sun-Hyoung Lee, Suk-Young Yoon, and Heesun Yang, Synthesis of Alloyed ZnSeTe Quantum Dots as Bright, Color-Pure Blue Emitters, ACS Appl. Mater. Interfaces 2019, 11, 46062-46069. (Year: 2019).*

* cited by examiner

Repeating the Patterning Process three times

QUANTUM DOT COMPOSITE, QUANTUM DOT, DEVICE INCLUDING THE SAME

CROSS-REFERENCE TO RELATED APPLICATION

This application claims priority to and the benefit of Korean Patent Application No. 10-2020-0134707, filed in the Korean Intellectual Property Office on Oct. 16, 2020, and all the benefits accruing therefrom under 35 U.S.C. § 119, the content of which in its entirety is incorporated herein by reference.

BACKGROUND

1. Field

A quantum dot composite and a device including the same are disclosed.

2. Description of the Related Art

Unlike a bulk material, physical characteristics (e.g., bandgap energies and melting points) of a semiconductor nanoparticle may be controlled by changing the size of the nanoparticle. For example, a semiconductor nanocrystal particle (also known as a quantum dot) is a crystalline material having a size in a range of several nanometers. Because the semiconductor nanocrystal particle has a relatively small size, the nanocrystal particle has a large surface area per a unit volume, and thereby, the particle exhibits a quantum confinement effect and will have different properties than bulk materials of the same chemical composition. A quantum dot may absorb energy from an excitation source, e.g., light or an applied electric current, and upon relaxation, e.g., return, to the ground state the quantum dot emits light energy corresponding to a bandgap energy of the quantum dot.

SUMMARY

An embodiment provides a cadmium-free quantum dot(s) capable of realizing, e.g., exhibiting, improved optical properties (e.g., luminous efficiency) and stability (e.g., oxidation stability).

An embodiment provides a method of producing the aforementioned cadmium-free quantum dots.

An embodiment provides a quantum dot composite including the cadmium-free quantum dot(s).

An embodiment provides a device, e.g., a display device, including the aforementioned cadmium-free quantum dot.

In an embodiment, a quantum dot composite includes a matrix and plurality of quantum dots and titanium oxide particles (hereinafter, also referred to as titanium oxide fine particle(s)) dispersed in the matrix, wherein the quantum dots include zinc, tellurium, and selenium, wherein the quantum dots do not include cadmium, lead, mercury, or a combination thereof, and wherein in the quantum dot composite, a weight ratio of tellurium with respect to titanium is greater than or equal to about 1.5:1 and less than or equal to about 10:1.

A quantum dot, e.g., at least one of the quantum dots, may have a core-shell structure. The core-shell structure may include a core including a first semiconductor nanocrystal including zinc, selenium, and tellurium, and a semiconductor nanocrystal shell disposed on the core and including a zinc chalcogenide that is different from the first semiconductor nanocrystal.

The quantum dot composite may show, e.g., exhibit, an absorption with respect to a blue light (for example, of a wavelength from about 450 nanometers (nm) to about 460 nm or of a wavelength of about 450 nm) that is greater than or equal to about 85%, greater than or equal to about 86%, greater than or equal to about 87%, greater than or equal to about 88%, greater than or equal to about 90%, and less than or equal to about 100%, less than or equal to about 95%, or less than or equal to about 94%.

The matrix may include an organic solvent, a monomer, a crosslinked polymer, a linear polymer, or a combination thereof.

The quantum dots and the titanium oxide fine particles may be mixed (e.g., intermixed) in the matrix.

In the quantum dot composite, a weight ratio of tellurium with respect to titanium may be greater than or equal to about 1.8:1, greater than or equal to about 2:1, or greater than or equal to about 2.5:1.

In the quantum dot composite, a weight ratio of zinc with respect to titanium may be greater than or equal to about 4:1, or greater than or equal to about 5:1; less than or equal to about 11.4:1; or a combination thereof.

In the quantum dot composite, a mole ratio of tellurium with respect to selenium (Te:Se) may be greater than or equal to about 0.1:1.

The quantum dot composite may not include an indium phosphide, an indium zinc phosphide, or a combination thereof.

The quantum dots may include a first semiconductor nanocrystal including ZnSeTe and a zinc chalcogenide different from the first semiconductor nanocrystal.

The zinc chalcogenide may include selenium, sulfur, or a combination thereof.

In the quantum dot composite, an amount of inorganic material may be greater than or equal to about 30 weight percent (wt %), based on a total weight of the quantum dot composite.

The quantum dot composite may include tellurium in an amount of greater than or equal to about 1.5 wt % based on a total weight of the quantum dot composite.

An average size (e.g., diameter) of the titanium oxide fine particles may be greater than or equal to about 100 nm.

An average size of the titanium oxide fine particles may be less than or equal to about 500 nm.

The quantum dot composite may include titanium in an amount of greater than or equal to about 1 wt % based on a total weight of the quantum dot composite.

The quantum dot composite may be configured to emit green light, and a maximum luminescent peak of the green light may have a full width at half maximum of less than or equal to about 40 nm.

The quantum dot composite may show, e.g., exhibit, an absorption of greater than or equal to about 90% with respect to a blue light of about 450 nm.

In an embodiment, a light emitting film includes a first section that is configured to emit a first light, and the first section includes the aforementioned quantum dot composite.

The light emitting film may further include a second section that is configured to emit a second light.

In an embodiment, a display device includes a light emitting element, and the light emitting element includes the aforementioned quantum dot composite or the aforementioned light emitting film.

In an embodiment, an electronic device may include a first electrode and a second electrode each having a surface opposite the other; and an active layer including the quantum dot composite disposed between the first and the second electrodes.

In an embodiment, quantum dots includes zinc, selenium, and tellurium, wherein the quantum dots do not include cadmium, lead, mercury, or a combination thereof, in the quantum dots, a mole ratio of tellurium with respect to selenium is greater than or equal to about 0.15:1, the quantum dots are configured to emit green light, and in a thermogravimetric analysis, the quantum dots show remaining mass of greater than or equal to about 60 wt % at a temperature of greater than or equal to about 500° C. and less than or equal to about 600° C., based on a total weight of the quantum dots.

The quantum dots have a core-shell structure and the core-shell structure includes a core including a first semiconductor nanocrystal and a semiconductor nanocrystal shell disposed on the core, wherein the first semiconductor nanocrystal includes zinc, tellurium, and selenium, and the semiconductor nanocrystal shell includes a zinc chalcogenide that is different from the first semiconductor nanocrystal.

In a thermogravimetric analysis, the quantum dots may show, e.g., exhibit, a 5% weight loss temperature of greater than or equal to about 300° C.

The quantum dots may include an organic ligand (e.g., bound on surfaces thereof). The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $R_2POOH$, a polymeric organic ligand, or a combination thereof wherein R and R' are the same or different, and are independently a substituted or unsubstituted C1 to C40 aliphatic hydrocarbon group or a substituted or unsubstituted C6 to C40 aromatic hydrocarbon group, or a combination thereof.

A maximum luminescent peak wavelength of the green light or the quantum dots may be greater than or equal to about 525 nm A maximum luminescent peak of the quantum dot may have a full width at half maximum of less than or equal to about 40 nm.

A quantum efficiency (or a quantum yield) of the quantum dot may be greater than or equal to about 50%.

In an embodiment, a method of preparing a quantum dot composite includes combining quantum dots including zinc, selenium, and tellurium, a dispersing agent, and a solvent to prepare a quantum dot dispersion; mixing the quantum dot dispersion with titanium oxide particles, a photoinitiator, and a polymerizable monomer to form a composition; and exposing the composition to light to polymerize the polymerizable monomer, form a matrix including the quantum dots and titanium oxide particles, and prepare the quantum dot composite, wherein in the quantum dot composite, a weight ratio of tellurium with respect to titanium is greater than or equal to about 1.5:1 and less than or equal to about 10:1. According to an embodiment are provided cadmium-free quantum dot(s) that emit light of a desired wavelength (e.g., green light or a light of a wavelength of greater than about 470 nm) with a relatively high level of a quantum efficiency and a relatively narrow full width at half maximum. The quantum dots of an embodiment may also be applied to, e.g., used in, a bio-labeling (biosensor, bio-imaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
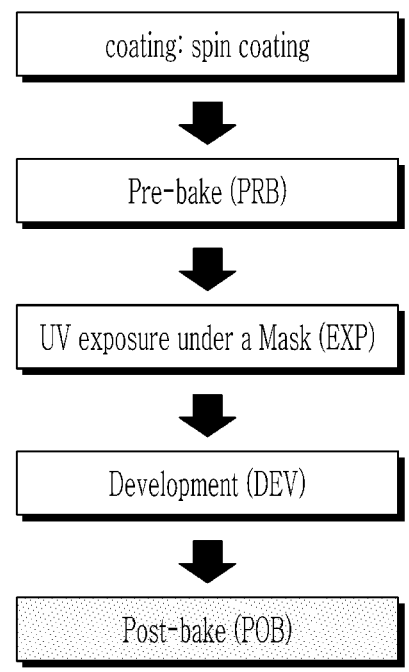
FIG. 1A schematically represents an embodiment of a process of producing a quantum dot composite pattern using a composition.
Figure 1A:

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

Unless otherwise defined, all terms used in the specification (including technical and scientific terms) may be used with meanings commonly understood by a person having ordinary knowledge in the art. It will be further understood that terms, such as those defined in commonly dictionary should be interpreted as having a meaning that is consistent with their meaning in the context of the relevant art, and may not be interpreted ideally or exaggeratedly unless clearly defined. The terminology used herein is for the purpose of describing particular embodiments only and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a hydrocarbon group refers to a group including (or consisting of) carbon and hydrogen (e.g., an alkyl, alkenyl, alkynyl, or aryl group). The hydrocarbon group may be a group having a valence of one (or greater) formed by removal of a hydrogen atom (or for example, a, e.g., at least one, hydrogen atom) from alkane, alkene, alkyne, or arene. In the hydrocarbon group, a, e.g., at least one, methylene may be replaced by an oxide moiety, a carbonyl moiety, an ester moiety, —NH—, or a combination thereof.

As used herein, "aromatic" refers to an organic compound or group comprising a, e.g., at least one, unsaturated cyclic group having delocalized pi electrons. The term encompasses both hydrocarbon aromatic compounds and heteroaromatic compounds.

As used herein, "alkyl" refers to a linear or branched saturated monovalent hydrocarbon group (methyl, ethyl, hexyl, etc.).

As used herein, "alkenyl" refers to a linear or branched monovalent hydrocarbon group having a carbon-carbon double bond.

As used herein, "alkynyl" refers to a linear or branched monovalent hydrocarbon group having a carbon-carbon triple bond.

As used herein, "aryl" refers to a group formed by removal of a, e.g., at least one, hydrogen from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, "(meth)acryl" refers to acryl, methacryl, or a combination thereof (e.g., an acrylate or methacrylate).

As used herein, "Group" refers to a group of Periodic Table.

As used herein, "Group III" may refer to Group IIIA and Group IIIB, and examples of Group III metal may be In, Ga, Tl, or a combination thereof, but are not limited thereto.

As used herein, "Group V" may include nitrogen, phosphorus, arsenic, antimony, bismuth, or a combination thereof but is not limited thereto.

As used herein, "Group VI" may include sulfur, selenium, tellurium, or a combination thereof, but is not limited thereto.

As used therein, the term "average" (e.g., an average size of the quantum dot) may be a mean or a median. In an embodiment, the average may be a "mean" average.

In an embodiment, a quantum efficiency (or a quantum yield) may be a ratio, e.g., relative amount, of photons emitted from a nanostructure (e.g., quantum dot) or a population thereof with respect to the photons absorbed by the nanostructure (e.g., quantum dot) or a population thereof. In an embodiment, the quantum efficiency may be determined by any suitable method. The quantum efficiency (or quantum yield) may be measured in a solution state or a solid state (as in a composite). The quantum efficiency may be measured by an absolute method and a relative method.

In the absolute method, the quantum yield may be determined by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The full width at half maximum (FWHM) and the maximum luminescent peak wavelength may be determined by a (photo)luminescent spectrum obtained by a spectrophotometer (or Fluorescence Spectrophotometer).

As used herein, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

Semiconductor nanoparticles (e.g., a quantum dots) may absorb energy from an excitation source (for example, a light source providing incident light or electrodes facing each other) and may emit light corresponding to a bandgap energy of the quantum dots. The bandgap energy of the quantum dot may vary with the size, the composition, or a combination thereof of the quantum dot. Semiconductor nanocrystals may be used as a light emitting material in various fields such as a display device, an energy device, or a bio light emitting device.

Quantum dots having relatively increased luminescence properties may include a toxic heavy metal such as cadmium (Cd), lead (Pb), mercury (Hg), or a combination thereof. A toxic heavy metal such as cadmium may cause environmental issues, health issues, or a combination thereof and is one of the restricted elements under Restriction of Hazardous Substances Directive (RoHS) in many countries. Accordingly, development of an environmentally friendly quantum dot having improved luminescence characteristics (as being applied to, e.g., for use in, a light emitting device such as an electro- or photoluminescent device) at a desired wavelength may be desired. An indium phosphide based quantum dot may be applied, e.g., used, in an actual device. ZnSeTe based quantum dots have potential for achieving high color purity in a green light emission region. However, the present inventors have found that it may be difficult to increase the luminous efficiency of ZnSeTe based quantum dots to a desired level for application thereof.

A display device using a photoluminescent property of quantum dots may include a light source emitting light of a wavelength of about 450 nm, but the present inventors have also found that increasing an absorption with respect to the blue light to a desired level (e.g., of greater than or equal to about 90%) for the cadmium-free quantum dots may be difficult. Thus, improving an absorption property and a luminous property for the cadmium-free quantum dot may be desired, but is still a challenging task as the absorption of the quantum dot may be related with, e.g., to, a variety of factors.

In an embodiment, a quantum dot composite including a zinc chalcogenide based quantum dot (such as a quantum dot including a $ZnSe_{1-x}Te_x$ alloy core) has the features as recited herein, exhibiting a desired level of a luminous property and an improved absorption with respect to blue light and contributing to the development of an environmentally friendly display device.

In an embodiment, the quantum dot composite includes a matrix and quantum dots and metal oxide fine particles (or titanium oxide fine particles) dispersed in the matrix. The quantum dots include zinc, selenium, and tellurium. The quantum dots may have a core-shell structure. The core-shell structure may include a core including a first semiconductor nanocrystal and a semiconductor nanocrystal shell including a zinc chalcogenide (for example, that is different from the first semiconductor nanocrystal). The quantum dot may not include cadmium, lead, mercury, or a combination thereof.

In the quantum dot composite, (for example, as measured by an inductively coupled atomic emission spectroscopy) a weight ratio (wt %:wt %) of tellurium with respect to titanium (or a main metal included in a metal oxide fine particle, hereinafter, the explanation will be provided for the titanium, but details of the same can be applied to the main metal) may be greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, or greater than or equal to about 2.5:1. In the quantum dot composite, a weight ratio of tellurium with respect to titanium may be less than or equal to about 10:1, less than or equal to about 9:1, less than or equal to about 8:1, less than or equal to about 7:1, less than or equal to about 6:1, less than or equal to about 5:1, less than or equal to about 4:1, or less than or equal to about 3:1. The quantum dot composite may exhibit an improved level of absorption with respect to a blue light (for example, having a wavelength of about 450 nm).

The quantum dots and the titanium oxide fine particle may be mixed with each other, e.g., intermixed, in the matrix, and in an embodiment, randomly distributed therein.

The quantum dots (e.g., the core) may include a predetermined amount of tellurium. As used herein, an amount of components included in the quantum dot(s) may be determined by using an appropriate analysis tool (e.g., an inductively coupled plasma atomic emission spectroscopy (ICP-AES), an X-ray photoelectron spectroscopy (XPS), an ion chromatography, a transmission electron microscopy energy-dispersive X-ray spectroscopy (TEM-EDS), or the like).

The quantum dot or the core may include an alloyed or doped nanocrystal material including zinc, selenium, and tellurium. In the core or the quantum dot, an amount of tellurium may be greater than or equal to selenium. In the quantum dot composite of an embodiment, a core or a first semiconductor nanocrystal included in the core may include $ZnSe_{1-x}Te_x$ (wherein x is greater than or equal to about 0.1, greater than or equal to about 0.2, greater than or equal to about 0.3, greater than or equal to about 0.4, greater than or equal to about 0.5, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, or greater than or equal to about 0.75 and less than or equal to about 0.9, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, less than or equal to about 0.8, less than or equal to about 0.75, less than or equal to about 0.74, less than or equal to about 0.73, less than or equal to about 0.72, less than or equal to about 0.71, less than or equal to about 0.70, less than or equal to about 0.69, less than or equal to about 0.68, less than or equal to about 0.67, less than or equal to about 0.66, less than or equal to about 0.65, less than or equal to about 0.6, less than or equal to about 0.5, less than or equal to about 0.4, less than or equal to about 0.3, or less than or equal to about 0.2).

In a quantum dot composite of an embodiment (or in the quantum dots as described herein), a mole ratio of tellurium with respect to selenium (Te:Se) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.93:1, greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In a quantum dot composite of an embodiment (or in the quantum dots as described herein), a mole ratio of tellurium with respect to selenium (Te:Se) may be less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, or less than or equal to about 0.9:1.

In a quantum dot composite of an embodiment (or in the quantum dots as described herein), a mole ratio of tellurium with respect to zinc (Te:Zn) may be greater than about 0.03:1, greater than or equal to about 0.04:1, greater than or equal to about 0.045:1, greater than or equal to about 0.05:1, greater than or equal to about 0.06:1, greater than or equal to about 0.09:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, or greater than or equal to about 0.43:1. In a quantum dot composite of an embodiment (or in the quantum dots as described herein), a mole ratio of tellurium with respect to zinc (Te:Zn) may be, for example as measured by an inductively coupled plasma atomic emission spectroscopy (ICP-AES), less than about 1:1, less than or equal to about 0.9:1, less than or equal to about 0.8:1, less than or equal to about 0.7:1, less than or equal to about 0.6:1, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, less than or equal to about 0.15:1, or less than or equal to about 0.1:1.

In a quantum dot composite of an embodiment (or in the quantum dots as described herein), a mole ratio of zinc with respect to tellurium (Zn:Te) may be greater than or equal to about 0.5:1, greater than or equal to about 1:1, greater than or equal to about 2:1, greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, greater than or equal to about 10:1, or greater than or equal to about 15:1. The mole ratio of zinc with respect to tellurium (Zn:Te) may be less than or equal to about 40:1, less than or equal to about 35:1, less than or equal to about 30:1, less than or equal to about 25:1, less than or equal to about 20:1, less than or equal to about 17:1, less than or equal to about 15:1, less than or equal to about 10:1, less than or equal to about 9:1, less than or equal to about 8.5:1, less than or equal to about 8:1, less than or equal to about 7.5:1, less than or equal to about 7:1, less than or equal to about 6.5:1, less than or equal to about 6:1, less than or equal to about 5.5:1, less than or equal to about 4.5:1, less than or equal to about 4:1, less than or equal to about 3.5:1, less than or equal to about 3:1, less than or equal to about 2.5:1, less than or equal to about 2.4:1, less than or equal to about 2.3:1, or less than or equal to about 2.25:1.

In a quantum dot composite of an embodiment, the quantum dots may further include sulfur, and in a quantum dot composite of an embodiment (or in the quantum dots as described herein), a mole ratio of sulfur with respect to zinc may be greater than or equal to about 0.005:1, greater than or equal to about 0.01:1, greater than or equal to about 0.015:1, greater than or equal to about 0.02:1, greater than or equal to about 0.025:1, greater than or equal to about 0.03:1, greater than or equal to about 0.035:1, greater than or equal to about 0.04:1, greater than or equal to about 0.045:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.35:1 and less than or equal to about 0.95:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.5:1, less than or equal to about 0.4:1, or less than or equal to about 0.3:1.

In a quantum dot composite of an embodiment (or in the quantum dots as described herein), a mole ratio of sulfur with respect to tellurium may be greater than 0:1, greater than or equal to about 0.1:1, greater than or equal to about 0.2:1, greater than or equal to about 0.3:1, greater than or equal to about 0.4:1, greater than or equal to about 0.5:1, greater than or equal to about 1:1, greater than or equal to about 3:1, greater than or equal to about 5:1, greater than or equal to about 6:1, greater than or equal to about 7:1, greater than or equal to about 9:1, or greater than or equal to about 10:1 and less than or equal to about 20:1, less than or equal to about 18:1, less than or equal to about 16:1, less than or equal to about 14:1, less than or equal to about 12:1, less than or equal to about 10:1, less than or equal to about 6:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1.

In a quantum dot composite of an embodiment (or in the quantum dots as described herein), a mole ratio of selenium with respect to tellurium (Se/Te) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.95:1, greater than or equal to about 1:1, greater than or equal to about 1.5:1, greater than or equal to about 2:1, greater than or equal to about 2.5:1, greater than or equal to about 3:1, greater than or equal to about 3.5:1, greater than or equal to about 4:1, greater than or equal to about 4.5:1, greater than or equal to about 5:1, or greater than or equal to about 5.5:1.

In a quantum dot composite of an embodiment (or in the quantum dots as described herein), a mole ratio of selenium with respect to tellurium (Se/Te) may be less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.45:1.

In a quantum dot composite of an embodiment (or in the quantum dots as described herein), a mole ratio of a sum of sulfur and selenium with respect to tellurium may be greater than or equal to about 2:1, greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, or greater than or equal to about 10:1. In a quantum dot composite of an embodiment (or in the quantum dots as described herein), a mole ratio of a sum of sulfur and selenium with respect to tellurium may be less than or equal to about 20:1, less than or equal to about 19:1, less than or equal to about 18:1, less than or equal to about 17:1, less than or equal to about 16:1, less than or equal to about 15:1, less than or equal to about 14:1, less than or equal to about 13:1, less than or equal to about 12:1, less than or equal to about 11:1, or less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, or less than or equal to about 2:1.

In an embodiment, the quantum dot may not include manganese, copper, or a combination thereof, for example in the core or in the shell. In an embodiment, the quantum dots or the quantum dot composite may not include a group III-V compound. The group III-V compound may include an indium phosphide, an indium zinc phosphide, a gallium phosphide, or a combination thereof.

In an embodiment, the quantum dots or the quantum dot composite may further include, for example, in the core or in the shell, aluminum, lithium, or a combination thereof. In the quantum dots or the quantum dot composite of an embodiment, if present, a mole ratio of aluminum, lithium, or a combination thereof with respect to tellurium may be greater than or equal to about 0.005:1, greater than or equal to about 0.009:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.41:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, greater than or equal to about 0.49:1, or greater than or equal to about 0.50:1. In the quantum dots or the quantum dot composite of an embodiment, if present, a mole ratio of aluminum, lithium, or a combination thereof with respect to tellurium may be less than or equal to about 1.5:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, or less than or equal to about 0.55:1.

In an embodiment, a quantum dot included in a quantum dot composite may include a semiconductor nanocrystal shell. The semiconductor nanocrystal shell may include zinc; and selenium, sulfur, or a combination thereof. The semiconductor nanocrystal shell may include ZnSe, ZnS, ZnSeS, or a combination thereof.

The shell may be a multi-layered shell including a plurality of layers. In the plurality of layers for the shell, adjacent layers may include different semiconductor materials. The multi-layered shell may include a first shell layer disposed on (e.g., directly on) the core and a second shell layer disposed on (e.g., directly on) or over the first shell layer. The first shell layer may include a second semiconductor nanocrystal. The second shell layer may include a third semiconductor nanocrystal having a composition different from the second semiconductor nanocrystal. The second shell layer may be the outermost layer of the quantum dot. The second semiconductor nanocrystal may include zinc, selenium, and optionally sulfur. The second semiconductor nanocrystal may include or may not include sulfur. The third semiconductor nanocrystal may include zinc and sulfur. The third semiconductor nanocrystal may not include selenium.

In an embodiment, the first shell layer may include ZnSe, ZnSeS, ZnS, or a combination thereof. The second shell layer may include or may consist of ZnS. In a quantum dot composite of an embodiment, the quantum dots may include a ZnSeTe core, a first shell layer including ZnSe disposed on the core, and a second shell layer including ZnS and disposed on the first shell layer.

A shell thickness or a thickness of each shell layer in a multi-layered shell may be selected appropriately. The thickness of the shell layer(s) (e.g., the first shell layer, the second shell layer, and if present the third shell layer) may be each independently greater than or equal to about 1 monolayer (ML), for example, greater than or equal to about 2 ML, greater than or equal to about 3 ML, greater than or equal to about 4 ML, greater than or equal to about 5 ML and less than or equal to about 10 ML, for example, less than or equal to about 9 ML, less than or equal to about 8 ML, less than or equal to about 7 ML, less than or equal to about 6 ML, or less than or equal to about 5 ML. The thickness of each shell layer in the multi-layered shell may be selected taking into consideration a desired composition of a final quantum dot.

In an embodiment, the shell or each of the shell layers in the multi-layered shell may include a gradient alloy having a composition varying in a direction of a radius, e.g., a radial direction from the core toward an outermost surface of the quantum dot. In an embodiment, an amount of the sulfur in the semiconductor nanocrystal shell may increase toward a surface of the quantum dot. For example, in the shell, the amount of the sulfur may increase in a direction away from the core, e.g., in a radial direction from the core toward an outermost surface of the quantum dot.

The quantum dot(s) (or a population thereof) may have a (average) particle size of greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm.

A size (or an average size) of the cadmium-free quantum dot (or a population thereof) may be less than or equal to about 50 nm, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, less than or equal to about 7.5 nm, less than or equal to about 7 nm, less than or equal to about 6.5 nm, less than or equal to about 6 nm, or less than or equal to about 5.5 nm.

In an embodiment, the size of the quantum dots (or the metal oxide fine particles) may refer to a diameter or an equivalent diameter obtained from a two-dimensional image of an electron microscopy analysis (e.g., under an assumption of a circle). In an embodiment, "a size" may refer to a size of a single quantum dot or a (e.g., a mean or a median) average of quantum dots or a population of the quantum dots. A size of the quantum dot(s) may be determined by using a result (e.g., an image) of a (transmission) electron microscopy analysis and any suitable image analysis computer program (e.g., Image J).

In the quantum dot of an embodiment, a size (or an average size) of the core(s) may be greater than or equal to about 1 nm, for example, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. A size (or an average size) of the core(s) may be less than or equal to about 7 nm, less than or equal to about 6 nm, less than or equal to about 5 nm, less than or equal to about 4 nm, less than or equal to about 3 nm, or less than or equal to about 2 nm.

In an embodiment, the quantum dot composite or the quantum dots included therein may show, e.g., exhibit, relatively increased quantum efficiency in comparison with other quantum dots based on Zn, Se, and Te. In an embodiment, the quantum dots or the quantum dot composite may show, e.g., exhibit, a quantum efficiency (or quantum yield) of greater than or equal to about 40%, greater than or equal to about 45%, greater than or equal to about 50%, greater than or equal to about 55%, greater than or equal to about 60%, or greater than or equal to about 65%. In an embodiment, the quantum dots or the quantum dot composite may show, e.g., exhibit, a quantum efficiency (or quantum yield) of less than or equal to about 100%. The quantum efficiency (or a quantum yield) may be a ratio of emitted photons therefrom for example as light emission with respect to the absorbed photons by the nanostructure (e.g., quantum dot) or a population thereof. The quantum efficiency may be measured for a quantum dot dispersion or a quantum dot polymer composite using an appropriate tool such as QE-2100 (manufactured by Otsuka electronics Co., Ltd.) but is not limited thereto.

In an embodiment, the quantum dot composite or the quantum dots may have a maximum luminescent (e.g., photoluminescent) peak in a wavelength region of greater than or equal to about 450 nm, greater than or equal to about 455 nm, greater than or equal to about 460 nm, greater than or equal to about 465 nm, greater than or equal to about 470 nm, greater than or equal to about 471 nm, greater than or equal to about 472 nm, greater than or equal to about 473 nm, greater than or equal to about 474 nm, greater than or equal to about 475 nm, greater than or equal to about 476 nm, greater than or equal to about 477 nm, greater than or equal to about 478 nm, greater than or equal to about 479 nm, greater than or equal to about 480 nm, greater than or equal to about 485 nm, greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm. The quantum dot composite or the quantum dots may have a maximum luminescent (e.g., photoluminescent) peak in a wavelength region of less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, or less than or equal to about 535 nm. In an embodiment, the quantum dots or the quantum dot composite may emit green light. The green light may have a maximum luminescent peak wavelength within the aforementioned range, for example, of from about 500 nm to about 560 nm (for example, from about 515 nm to about 535 nm, from about 520 nm to about 540 nm, or from about 525 nm to about 550 nm).

In an embodiment, the quantum dot composite or the quantum dots may exhibit a full width at half maximum of less than or equal to about 50 nm, less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm. In an embodiment, the quantum dot composite or the quantum dots may exhibit a full width at half maximum of greater than or equal to about 1 nm, greater than or equal to about 5 nm, greater than or equal to about 10 nm, or greater than or equal to about 20 nm.

In an embodiment, the quantum dots may include an organic ligand e.g., on a surface thereof. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO$(OH)_2$, RHPOOH, $R_2POOH$, a polymeric organic ligand, or a combination thereof wherein R and R' are the same or different, and are independently a substituted or unsubstituted C1 to C40 (e.g., a C3 to C30 or a C6 to C24) aliphatic hydrocarbon (e.g., alkyl, alkenyl, or alkynyl) group or a substituted or unsubstituted C6 to C40 aromatic hydrocarbon group, or a combination thereof. Two or more different organic ligand may be used.

The organic ligand may coordinate to, e.g., be bound to, the surface of the quantum dot, helping the nanocrystal to be well dispersed in the solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, or a substituted or unsubstituted octylphosphine (e.g., trioctylphosphine (TOP)); a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, or a substituted or unsubstituted octylphosphine oxide (e.g., trioctylphosphine oxide (TOPO)); diphenylphosphine, diphenylphosphine oxide, triphenylphosphine, or triphenylphosphine oxide; a mono- or di(C5 to C20 alkyl)phosphinic acid such as a mono- or dihexylphosphinic acid, a mono- or dioctylphosphinic acid, a mono- or di(dodecyl)phosphinic acid, a mono- or di(tetradecyl)phosphinic acid, a mono- or di(hexadecyl)phosphinic acid, a mono- or di(octadecyl)phosphinic acid, or a combination thereof; a C5 to C20 alkylphosphinic acid, a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; or a combination thereof, and the like, but are not limited thereto. Two or more different organic ligand compound may be used.

In an embodiment, the organic ligand compound may be a combination of RCOOH and an amine (e.g., $RNH_2$, $R_2NH$, $R_3N$, or a combination thereof). In an embodiment, the organic ligand may not include an organic compound having a thiol moiety and an amino group, a carboxylic acid group, or a combination thereof.

In an embodiment, the organic ligand may not include a multifunctional organic compound having a thiol moiety and an amino group, a carboxylic acid group, or a combination thereof. In an embodiment, the organic ligand may not include glutathione compound. The quantum dot may be water-insoluble. The quantum dots may be dispersed in a cyclohexyl acetate (CHA). In the embodiment, the quantum dots may show, e.g., exhibit, an optical density (OD) of greater than or equal to about 0.9, greater than or equal to about 0.95, greater than or equal to about 1, greater than or equal to about 1.1, greater than or equal to about 1.2, or greater than or equal to about 1.3, when being dispersed in the CHA at a predetermined concentration (e.g., about 23 wt %).

In an embodiment, a method of manufacturing the foregoing cadmium-free quantum dot(s) includes:

preparing a core including a first semiconductor nanocrystal including zinc, tellurium, and selenium for example, by reacting a zinc precursor, a selenium precursor, and tellurium precursor at a core formation temperature;

in a third organic solvent, in the presence of the core particle and a third organic ligand, reacting a zinc precursor with a non-metal precursor of a selenium precursor, a sulfur precursor, or a combination thereof at a shell formation temperature to form a semiconductor nanocrystal shell including zinc; and selenium, sulfur, or a combination thereof on a surface of the core.

The preparing of the core may include preparing a zinc precursor organic solution including a zinc precursor and a first organic ligand in a first organic solvent; and, while heating the zinc precursor organic solution at the core formation temperature, adding thereto a selenium precursor, a tellurium precursor, a hydride compound, and a, e.g., at least one, second organic ligand.

The core formation temperature may be greater than or equal to about 250° C., greater than or equal to about 260° C., greater than or equal to about 270° C., greater than or equal to about 280° C., greater than or equal to about 290° C., or greater than or equal to about 300° C. The core formation temperature may be greater than or equal to about 280° C. The reaction temperature for the core formation may be less than or equal to about 350° C., for example, less than or equal to about 340° C., less than or equal to about 330° C., less than or equal to about 320° C., or less than or equal to about 310° C. The reaction time for the core formation is not particularly limited and may be selected appropriately.

The reaction temperature for the shell formation may be selected appropriately in any suitable range of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., or greater than or equal to about 290° C. and less than or equal to about 340° C., for example, less than or equal to about 325° C., or less than or equal to about 310° C. The reaction time for the shell formation may be selected appropriately in light of a desired shell composition.

The reaction time for the core formation and/or the reaction time for the shell formation may be greater than or equal to about 5 seconds, greater than or equal to about 10 seconds, greater than or equal to about 20 seconds, greater than or equal to about 30 seconds, greater than or equal to about 1 minute, greater than or equal to about 5 minutes, greater than or equal to about 10 minutes, greater than or equal to about 20 minutes, greater than or equal to about 30 minutes, greater than or equal to about 40 minutes, greater than or equal to about 50 minutes, greater than or equal to about 1 hour, and greater than or equal to about 3 hours, less than or equal to about 5 hours, less than or equal to about 3 hours, less than or equal to about 2 hours, less than or equal to about 1 hours, less than or equal to about 30 minutes, less than or equal to about 20 minutes, less than or equal to about 10 minutes, less than or equal to about 5 minutes, or less than or equal to about 1 minute.

The composition of the quantum dots and details of the core and the shell are the same as set forth herein. The synthesized core may be separated from the reaction system for example by using a non-solvent, for example, prior to the shell formation. The separation using the non-solvent may be explained in detail herein.

In an embodiment, the tellurium precursor used during the core synthesis may include tellurium dispersed in a second organic solvent and a concentration of the tellurium in the tellurium precursor may be greater than about 0.1 moles per liter (molar (M)), for example, greater than or equal to about 0.5 M, greater than or equal to about 1 M, greater than or equal to about 1.5 M, greater than or equal to about 2 M, or greater than or equal to about 2.5 M. The concentration of the tellurium may be less than or equal to about 10 M, less than or equal to about 5 M, or less than or equal to about 4 M. In an embodiment, using the tellurium precursor at the aforementioned range of the concentration may contribute to enhance a reactivity of the tellurium precursor, providing an improved quality of the core.

In an embodiment, on the synthesis of the core, prior to being added to the zinc precursor organic solution, the selenium precursor, the tellurium precursor, the metal hydride compound, and the second organic ligand may be mixed at a temperature of less than about 80° C., for example, less than or equal to about 75° C., less than or equal to about 70° C., less than or equal to about 65° C., less than or equal to about 60° C., less than or equal to about 55° C., less than or equal to about 50° C., or less than or equal to about 45° C. to form a single stock solution. The temperature may be greater than or equal to about 10° C., greater than or equal to about 20° C., or for example about room temperature.

The second organic ligand may be an aliphatic organic amine compound or a combination thereof.

The metal hydride compound may include lithium, aluminum, or a combination thereof. The metal hydride compound may include an aluminum hydride compound, a lithium hydride compound, or a combination thereof. The metal hydride compound may include an organic metal hydride compound (for example, having a, e.g., at least one, hydrocarbon group (e.g., a C1 to C18 alkyl, C2 to C18 alkenyl, or C2 to C18 alkynyl group) or a C6 to C40 aromatic hydrocarbon group, or a combination thereof), an inorganic metal hydride compound, or a combination thereof. The metal hydride compound may include an alkyl lithium hydride; a dialkyl lithium borohydride; a lithium aluminum hydride compound, or a combination thereof.

An amount of the metal hydride is not particularly limited and may be selected appropriately. An amount of the metal hydride may be, per one mole of tellurium, greater than or equal to about 0.01 moles, greater than or equal to about 0.05 moles, greater than or equal to about 0.1 moles, greater than or equal to about 0.5 moles, or greater than or equal to about 1 mole. An amount of the metal hydride may be, per one mole of tellurium, less than or equal to about 10 moles, less than or equal to about 5 moles, or less than or equal to about 3 moles.

During preparation of the core, a mole ratio of the tellurium with respect to the selenium introduced into the reaction system (Te:Se) may be greater than about 0.25:1, greater than or equal to about 0.3:1, greater than or equal to about 0.4:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, or greater than or equal to about 2.5:1.

During preparation of the core, a mole ratio of the tellurium with respect to the selenium introduced into the reaction system (Te:Se) may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1.5:1.

During preparation of the core, a mole ratio of the zinc with respect to the tellurium may be selected appropriately taking into consideration a desired composition, the precursor(s), or the like. According to an embodiment, during preparation of the core, an amount of the zinc with respect to one mole of the tellurium may be greater than or equal to about 1 mole, greater than or equal to about 2 moles, greater than or equal to about 3 moles, greater than or equal to about 4 moles, or greater than or equal to about 5 moles. According to an embodiment, during preparation of the core, an amount of the zinc with respect to one mole of the tellurium may be, less than or equal to about 20 moles, less than or equal to about 15 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

In an embodiment, formation of the shell may include heating (or vacuum treating) an organic ligand in an organic solvent at a predetermined temperature (e.g., at a temperature of greater than or equal to about 100° C., for example, greater than or equal to about 120° C.) under vacuum, changing an atmosphere of a reaction system into an inert gas and heating the same at a predetermined reaction temperature. The core and a non-metal shell precursor (e.g., sulfur and selenium precursors) may be added into the (heated) reaction system to carry out a reaction. The shell precursor(s) may be injected at the same time or sequentially during the reaction taking into consideration a desired shell composition.

The shell having a desired composition (e.g., a gradient composition or a multi-layered composition) may be formed.

In an embodiment, a zinc precursor may react with a selenium precursor to form a first shell layer including zinc and selenium and then reacted with a sulfur precursor to form a second shell layer including zinc and sulfur. In an embodiment, the semiconductor nanocrystal shell formation may include reacting the zinc precursor with the selenium precursor and the sulfur precursor.

In the foregoing method, the zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bis(trimethylsilyl)sulfide, bis(trimethylsilylmethyl) sulfide, ammonium sulfide, sodium sulfide, or a combination thereof.

The (first to third) organic solvent or an organic solvent used for the core formation, shell formation or a combination hereof may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one (e.g., 1, 2, or 3), C6 to C22 alkyl group, a phosphine oxide (e.g., trioctylphosphine oxide) substituted with a, e.g., at least one (e.g., 1, 2, or 3), C6 to C22 alkyl group, a C12 to C22 aromatic ether such as a phenyl ether or a benzyl ether, or a combination thereof.

The present inventors have found that using a reagent having a polymerizable moiety during the formation of a zinc chalcogenide shell on a ZnSeTe core may cause a sharply increased amount of organics in resulting particles (in other words, a sharply decreased amount ratio of the inorganics when being determined in the TGA analysis of the particles). The present inventors have also found that the sharply increased amount of the organics can considerably limit an amount of the light emitter (i.e., the quantum dots) actually included in the composite. Meanwhile, in addition to the quantum dots, the composite may further include $TiO_2$ fine particles in a predetermined amount for a desired luminous property thereof, and in the composite, an amount of titanium can represent an amount of the $TiO_2$ fine particles and an amount of tellurium may represent an actual amount of the quantum dots of the embodiment.

According to the research of the present inventors, total amounts of the quantum dots and the $TiO_2$ fine particles may be limited due to their dispersability, and thus, under the circumstances, if a composite of a desired luminous property includes the quantum dots including the sharply increased amount of organics, a ratio of the tellurium to titanium in the composite cannot be greater than or equal to about 1.1:1.

Surprisingly, the present inventors have found that by minimizing (or substantially avoiding or not using) the use of reagents having a polymerizable moiety (e.g., a carbon-carbon double bond) during the synthesis of the quantum dot, the resulting quantum dots may exhibit a greatly increased residue amount (i.e., the inorganic amount or the remaining mass) in their TGA analysis, indicating that they include organics in a relatively limited or reduced amount. The present inventors have also found that adopting such quantum dots of the embodiment for preparing a quantum dot polymer composite may bring forth a significant improvement of the optical or luminous properties of the composite (e.g., an increased absorption ratio).

In an embodiment, the shell formation may be carried out using an organic solvent that has a relatively high temperature and does not include a carbon-carbon double bond or a polymerizable moiety. In an embodiment, the shell formation may be carried out with using an organic ligand without any carbon-carbon double bond. The organic solvent for the shell formation may be an organic solvent having no carbon-carbon double bond, a trialkyl phosphine compound, or a trioctyl amine. Using the aforementioned organic solvent may contribute to decreasing an organic substance attached to a surface of the quantum dot, whereby the quantum dots may show, e.g., exhibit, an increased inorganic content ratio.

At least two, or all of the first organic ligand, the second organic ligand, and the third organic ligand may each be the same. At least two, or all of the first organic ligand, the second organic ligand, and the third organic ligand may each be different. Details of the first and the second organic ligands and the third organic ligand are the same as set forth herein with regard to the organic ligand.

In an embodiment, the first organic ligand may include a fatty acid (having an aliphatic hydrocarbon group) or a combination thereof, and the second organic ligand may include an organic amine, an aromatic phosphine compound, or a combination thereof. The organic amine may include a primary amine having one aliphatic hydrocarbon group or one aromatic hydrocarbon group. The primary amine may include $RNH_2$ wherein R is an aliphatic hydrocarbon group or an aromatic hydrocarbon group.

The carbon number of the aliphatic hydrocarbon group may be greater than or equal to about 5, greater than or equal to about 10, greater than or equal to about 15, greater than or equal to about 16, greater than or equal to about 17, greater than or equal to about 18, greater than or equal to about 19, or greater than or equal to about 20; less than or equal to about 50, less than or equal to about 40, or less than or equal to about 30; or a combination hereof. The aliphatic hydrocarbon group may include alkyl, alkenyl, alkynyl, or a combination thereof. The aromatic hydrocarbon group may be a $C_{6-40}$ aryl group.

Amounts of the first organic ligand and the second organic ligand may be selected taking into consideration types of the organic ligands and types of the precursors. An amount of the first organic ligand (or an amount of the second ligand or an amount of the third ligand) may be, with respect to 1 mole of the zinc precursor, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 moles, greater than or equal to about 2 moles, greater than or equal to about 3 moles, greater than or equal to about 4 moles, or greater than or equal to about 5 moles. An amount of the first organic ligand (or an amount of the second ligand or an amount of the third ligand) may be, with respect to 1 mole of the zinc precursor, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole.

A mole ratio between the first organic ligand and the second organic ligand (the first organic ligand:the second organic ligand) may be 1:about 0.1 or greater, 1:about 0.5 or greater, 1:about 0.9 or greater, or 1:about 1 or greater; 1:about 10 or less; 1:about 5 or less, 1:about 2.5 or less, or 1:about 1.5 or less; or a combination thereof.

In an embodiment, the selenium precursor, the tellurium precursor, the metal hydride compound may be injected into the zinc precursor organic solution in a mixed state optionally with the organic ligand. In an embodiment, the selenium precursor, the tellurium precursor, and the metal hydride compound may be injected into the zinc precursor organic solution sequentially.

In a reaction system for the core formation and in a reaction system for the shell formation, an amount of each precursor and a concentration thereof may be selected taking into consideration a desired composition of the core and the shell, a reactivity between the core and shell precursors, or the like. In an embodiment, taking into consideration a desired composition of a final quantum dot (e.g., a ratio between elements such as Zn, S, Se, Te, or a combination thereof), ratios between the precursors may be controlled. The composition of the final quantum dot may be determined by an appropriate analysis tool such as an inductively coupled plasma atomic emission spectroscopy.

After the formation of the core, after the formation of the shell, or a combination thereof, a non-solvent is added to reaction products and the nanocrystal particles coordinated with, e.g., bound to, the ligand compound may be separated. The non-solvent may be a polar solvent that is miscible with the solvent used in the core formation reaction, shell formation reaction, or a combination thereof and is not capable of dispersing the produced nanocrystals therein. The non-solvent may be selected taking into consideration the solvent used in the reaction and may be for example acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing (or dispersing) solvent and washed (or dispersed), if desired. Types of the washing (dispersing) solvent are not particularly limited and a solvent having similar solubility parameter to that of the ligand may be used and examples thereof may include hexane, heptane, octane, chloroform, toluene, benzene, or the like.

In an embodiment, the organic ligand may not include a multifunctional organic compound having a thiol moiety and an amino group, a carboxylic acid, or a combination thereof. In an embodiment, the organic ligand may not include glutathione compound.

The quantum dot may be water-insoluble. When dispersed in water, the quantum dot may show, e.g., exhibit, an average particle size of greater than or equal to about 300 nm, greater than or equal to about 400 nm, greater than or equal to about 500 nm, or greater than or equal to about 900 nm as determined by a dynamic light scattering (DLS) analysis.

When dispersed in an organic solvent (such as toluene, octane, or the like), the quantum dot may be configured to form an organic solution having an average particle size of less than or equal to about 500 nm, less than or equal to about 400 nm, less than or equal to about 300 nm, less than or equal to about 200 nm, less than or equal to about 100 nm, or less than or equal to about 90 nm as determined by a DLS analysis. Examples of the organic solvent are described herein.

The quantum dots included in the composite of an embodiment may be configured to have a relatively decreased amount of an organic material. In an embodiment, the quantum dots included in the composite may have an increased amount of inorganic material. Without wishing to be bound by any theory, in the quantum dots included in the composite of the embodiment may have an increased amount of inorganic material that are directly related to emission of the composite, whereby the composite of the embodiment may show, e.g., exhibit, an increased level of light absorption. The increased level of the light absorption may suppress a blue light mixing in the device and thus a color reproducibility of the device including the composite may increase and a photoconversion efficiency of a desired light may also increase, improving the brightness of the device.

In the quantum dot composite, an amount (or a total amount) of the inorganic substance (e.g., a sum of zinc, tellurium, selenium, sulfur, and titanium) may be, for example as determined by an inductively coupled plasma atomic emission spectroscopy, greater than or equal to about 13.83 wt %, greater than or equal to about 20 wt %, greater than or equal to about 25 wt %, greater than or equal to about 30 wt %, greater than or equal to about 31 wt %, or greater than or equal to about 32 wt %. In an embodiment, an amount of the inorganic material may be, for example as determined by an inductively coupled plasma atomic emission spectroscopy, from about 20 wt % to about 100 wt %, from about 25 wt % to about 90 wt %, from about 30 wt % to about 80 wt %, from about 31 wt % to about 70 wt %, from about 32 wt % to about 60 wt %, or a combination thereof.

In a quantum dot composite of an embodiment, a weight ratio of zinc with respect to titanium may be greater than or equal to about 4:1, greater than or equal to about 5:1, greater than or equal to about 6:1, greater than or equal to about 7:1, or greater than or equal to about 7.5:1. In a quantum dot composite of an embodiment, a weight ratio of zinc with respect to titanium may be less than or equal to about 11.4:1, less than or equal to about 11:1, less than or equal to about 10.5:1, less than or equal to about 10:1, or less than or equal to about 9:1. In the quantum dot composite, an amount of the tellurium may be greater than 1.46 wt %, greater than or equal to about 1.5 wt %, greater than or equal to about 2 wt %, greater than or equal to about 2.5 wt %, greater than or equal to about 3 wt %, greater than or equal to about 3.5 wt %, or greater than or equal to about 4 wt %. The amount of the tellurium may be from about 1.5 wt % to about 30 wt %, from about 2 wt % to about 25 wt %, from about 2.5 wt % to about 20 wt %, from about 3 wt % to about 17 wt %, from about 3.5 wt % to about 15 wt %, from about 4 wt % to about 14 wt %, or from about 5 wt % to about 10 wt %.

In the quantum dot composite, an amount of titanium may be greater than or equal to about 1 wt %, greater than or equal to about 1.5 wt %, or greater than or equal to about 2 wt %, or greater than or equal to about 5 wt % based on a total weight of the quantum dot composite. In the quantum dot composite, an amount of titanium may be less than or equal to about 25 wt %, less than or equal to about 20 wt %, less than or equal to about 15 wt %, less than or equal to about 10 wt %, or less than or equal to about 5 wt %.

The amount of each component can be determined by for example as determined by an inductively coupled plasma atomic emission spectroscopy, The quantum dots included in the quantum dot composite of an embodiment may show, e.g., exhibit, a residue (e.g., a remaining mass) of greater than or equal to about 60 wt %, greater than or equal to about 65 wt %, greater than or equal to about 70 wt %, or greater than or equal to about 75 wt %, at a temperature of greater than or equal to about 500° C. and less than or equal to about 600° C., as determined in a thermogravimetric analysis. In an embodiment, the residue (e.g., the remaining mass) may be from about 60 wt % to about 100 wt %, from about 65 wt % to 90 wt %, from about 70 wt % to about 85 wt %, or from about 75 wt % to about 80 wt %. The quantum dots (included in the quantum dot composite) of an embodiment may show, e.g., exhibit, a 5% weight loss temperature of greater than or equal to about 300° C., greater than or equal to about 310° C., greater than or equal to about 320° C., greater than or equal to about 330° C., greater than or equal to about 340° C., greater than or equal to about 350° C., greater than or equal to about 360° C., greater than or equal to about 370° C., greater than or equal to about 380° C., greater than or equal to about 390° C., or greater than or equal to about 400° C.

The quantum dots (included in the quantum dot composite) of an embodiment may show, e.g., exhibit, a 5% weight loss temperature of from about 300° C. to about 600° C. or from about 320° C. to about 500° C.

With respect to blue light (e.g., of wavelength from about 450 nm to about 460 nm or of a wavelength of about 450 nm), the quantum dot composite of an embodiment may show, e.g., exhibit, an absorption of greater than or equal to about 88%, greater than or equal to about 89%, greater than or equal to about 90%, greater than or equal to about 91%, greater than or equal to about 92%, or greater than or equal to about 93%.

The absorption of the quantum dot composite to blue light may be measured by using an integration sphere. For measuring the blue light absorption, a light amount of blue light of a light source (B) is measured, then, a given QD composite is placed in an integration sphere, the light from the light source (B) is irradiated to the composite, and an amount of converted light (e.g., green light or red light) emitted from the composite (A) and a light amount of the blue light passing through the composite (B') are measured, respectively. From the measured values, the photoconversion ratio and the blue light absorption ratio are measured as below:

Photoconversion ratio (QE)=A/B

Blue light absorption ratio=(B−B')/B.

The quantum dot composite may be prepared from a composition including the quantum dots set forth herein. In an embodiment, a quantum dot composition includes the aforementioned (e.g., a plurality of) quantum dot(s); and optionally a monomer. The composition may further include an organic solvent, a liquid vehicle, or a combination thereof, a dispersing agent, a (thermal or photo) initiator or a combination thereof. The dispersing agent may disperse the quantum dots in the composition. The dispersing agent may include a carboxylic acid group containing compound (e.g., a monomer or a polymer). The composition may be a photosensitive composition.

Details of the quantum dots in the composition are as described herein. An amount of the quantum dot(s) in the composition (or a composite as described herein) may be appropriately adjusted taking into consideration a desirable final use (e.g., a photoluminescent color filter, etc.) and components of the composition (or the composite). In an embodiment, the amount of the quantum dots may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight or a total solids content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total weight or a total solids content of the composition. The weight percentage of the components relative to the total solids content in the composition may represent the contents of the components in the composite, which will be described herein.

In the composition according to an embodiment, the dispersing agent may ensure dispersion of the quantum dots. In an embodiment, the dispersing agent may be a binder (or binder polymer). The binder may include an organic compound (e.g., a monomer or a polymer) optionally including a carboxylic acid group (e.g., in the repeating unit). The binder may be an insulating polymer.

The organic compound including a carboxylic acid group may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
    a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or
    a combination thereof.

The dispersing agent may include the first monomer, the second monomer, the third monomer, or a combination thereof.

In the composition, an amount of the dispersing agent (or the binder polymer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight or a total solid content of the composition, but is not limited thereto. The amount of the dispersing agent (or the binder polymer) may be less than or equal to about 55 wt %, for example, less than or equal to about 45 wt %, less than or equal to about 35 wt %, less than or equal to about 33 wt %, or less than or equal to about 30 wt %, based on a total weight or a total solid content of the composition.

The composition may include a polymerizable (e.g., photopolymerizable) monomer (hereinafter, may be referred to as "monomer") including the carbon-carbon double bond. The monomer may include a (e.g., photopolymerizable) (meth)acryl-based, i.e., (meth)acryl-containing, monomer. The monomer may be a precursor for an insulating polymer.

An amount of the monomer may be greater than or equal to about 0.5 wt %, for example, greater than or equal to about 1 wt %, greater than or equal to about 2 wt %, greater than or equal to about 5 wt %, or greater than or equal to about 10 wt %, based on a total weight or a total solid content of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight or a total solid content of the composition.

The (photo)initiator included in the composition is a compound that initiates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the composite that will be described herein) may further include a (multiple or mono-functional) thiol compound having a, e.g., at least one, thiol group (for example, at the terminal end), a metal oxide fine particle (or a titanium oxide fine particle), or a combination thereof.

The metal oxide fine particle may include $TiO_2$, $SiO_2$, $BaTiO_3$, $Ba_2TiO_4$, $ZnO$, or a combination thereof. The metal oxide fine particle may include a titanium oxide fine particle, silicon oxide (silica) fine particle, barium titanium oxide fine particle, a zinc oxide fine particle, or a combination thereof. In the composition, an amount of the metal oxide fine particle may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content) of the composition. The metal oxide fine particle may be non-emissive (e.g., not emitting light). The metal oxide may include an oxide of a metal or a metalloid.

The metal oxide fine particle may have an appropriately selected diameter without a particular limit. The diameter of the metal oxide fine particle may be greater than or equal to about 100 nm, for example, greater than or equal to about 150 nm, or greater than or equal to about 200 nm and less than or equal to about 1000 nm or less than or equal to about 800 nm.

The polythiol compound may be a dithiol compound, a trithiol compound, a tetrathiol compound, or a combination thereof. For example, the thiol compound may be glycoldi- 3-mercaptopropionate, glycoldimercaptoacetate, trimethylolpropane-tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight or a total solid content of the composition.

In the composition (or the composite), an amount of the metal oxide or the titanium oxide (fine particle) may be greater than or equal to about 1 wt %, greater than or equal to about 5 wt %, greater than or equal to about 10 wt %, greater than or equal to about 15 wt %, greater than or equal to about 17 wt %, greater than or equal to about 19 wt %, greater than or equal to about 20 wt %, greater than or equal to about 25 wt %, or greater than or equal to about 30 wt %, greater than or equal to about 35 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight or a total solid content of the composition.

The composition may further include an organic solvent (or a liquid vehicle, hereinafter referred to as a solvent). Types of the usable organic solvent are not particularly limited. Examples of the solvent may include, but are not limited to: ethyl 3-ethoxy propionate; an ethylene glycol series such as ethylene glycol, diethylene glycol, or polyethylene glycol; a glycol ether series such as ethylene glycol monomethyl ether, ethylene glycol monoethyl ether, diethylene glycol monomethyl ether, ethylene glycol diethyl ether, or diethylene glycol dimethyl ether; glycol ether acetates series such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate series such as propylene glycol monomethyl ether acetate or dipropylene glycol monoethyl ether acetate; an amide series such as N-methylpyrrolidone, dimethyl formamide, or dimethyl acetamide; a ketone series such as methyl ethyl ketone (MEK), methyl isobutyl ketone (MIBK), or cyclohexanone; a petroleum product such as toluene, xylene, or solvent naphtha; an ester series such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the solid content (non-volatile components).

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. With the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m.

In an embodiment, the composition may further include an additive, for example, included in a photoresist composition or an ink composition. The additive may include a light diffusing agent, a leveling agent, or a coupling agent in addition to the aforementioned components. Details of the additive may refer to the ones as described in, for example, US-2017-0052444-A1.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., an acryl-based monomer), optionally, the thiol compound, optionally, the metal oxide fine particles, and optionally, the aforementioned additive. Each of the aforementioned components may be mixed sequentially or simultaneously, but mixing orders are not particularly limited.

The composition according to an embodiment may be used to provide a quantum dot composite pattern (e.g., a patterned quantum dot polymer composite). The composition may provide a quantum dot-polymer composite by a (e.g., radical) polymerization. The composition according to an embodiment may be a photoresist composition including quantum dots applicable to a photolithography method. The composition according to an embodiment may be an ink composition that may provide a pattern by printing (e.g., a droplet discharge method such as inkjet printing).

The quantum dot (polymer) composite includes a matrix (e.g., a polymer matrix); and the aforementioned quantum dots and the metal oxide fine particles (e.g., titanium oxide fine particles) dispersed in the matrix. The (polymer) matrix may include a linear polymer, a crosslinked polymer, or a combination thereof. The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. The linear polymer may include a repeating unit derived from carbon-carbon unsaturated bonds (e.g., carbon-carbon double bond). The repeating unit may include a carboxylic acid group. The linear polymer may include an ethylene repeating unit.

The matrix may include a dispersing agent (e.g., a binder monomer or polymer including a carboxylic acid group), a polymerization product (e.g., an insulating polymer) of a polymerizable monomer having a carbon-carbon double bond (a, e.g., at least one, for example, at least two, at least three, at least four, or at least five), optionally a polymerization product of the polymerizable monomer and a thiol compound (e.g., a polythiol compound having at least two thiol groups for example, at a terminal end thereof), or a combination thereof.

The cross-linked polymer may include a thiolene resin, a cross-linked poly(meth)acrylate, or a combination thereof. In an embodiment, the cross-linked polymer may be a polymerization product of the polymerizable monomer and, optionally, a polythiol compound having at least two thiol groups (e.g., at a terminal end thereof). The quantum dot, the dispersing agent, or the binder polymer, the polymerizable monomer, and the polythiol compound may be the same as described herein.

A film of the quantum dot composite (or a pattern thereof as described herein) may have for example a thickness of less than or equal to about 30 micrometers ($\mu m$), for example, less than or equal to about 25 $\mu m$, less than or equal to about 20 $\mu m$, less than or equal to about 15 $\mu m$, less than or equal to about 10 $\mu m$, less than or equal to about 8 $\mu m$, or less than or equal to about 7 $\mu m$ and greater than or equal to about 2 $\mu m$, for example, greater than or equal to about 3 $\mu m$, greater than or equal to about 3.5 $\mu m$, greater than or equal to about 4 $\mu m$, greater than or equal to about 5 $\mu m$, or greater than or equal to about 6 $\mu m$.

In an embodiment, a patterned film of the quantum dot composite may include a, e.g., at least one, repeating section configured to emit predetermined light. In an embodiment, the repeating section may include a first section configured to emit first light. The repeating section may further include a second section emitting a second light having different wavelength from the first light. The first section, the second section, or a combination thereof may include the aforementioned quantum dot (polymer) composite.

The first light or the second light may be red light having a maximum photoluminescence peak wavelength that is between about 600 nm and about 650 nm (e.g., about 620 nm to about 650 nm), or green light having a maximum photoluminescence peak wavelength that is between about 500 nm and about 550 nm (e.g., about 510 nm to about 540 nm). The patterned film may further include a third section that may pass or emit a third light (e.g., blue light) different from the first light and the second light. The third light may include an excitation light. The third light (or the excitation light) may include blue light having a maximum peak wavelength ranging from about 380 nm to about 480 nm and optionally green light.

In an embodiment, a patterned quantum dot composite film may be produced by a method using the photoresist composition. The method may include:
  forming a film of the composition on a substrate (S1);
  optionally prebaking the film (S2);
  exposing a selected region of the film to light (e.g., a wavelength of less than or equal to about 400 nm) (S3); and
  developing the exposed film with an alkali developing solution to obtain a pattern including the quantum dot-polymer composite (S4).

Non-limiting methods of forming the pattern are illustrated, referring to FIG. 1A.

The composition may be coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

The formed (or optionally pre-baked) film may be exposed to light having a predetermined wavelength under a mask (e.g., a photomask) (see FIG. 1A) having a predetermined pattern (S3). A wavelength and intensity of the light may be selected by taking into consideration the initiator (e.g., photoinitiator), an amount of the initiator (e.g., photoinitiator), the quantum dots, amounts of the quantum dots, and the like. In FIG. 2A, BM is an abbreviation for a black matrix.

The exposed film may be treated with an alkali developing solution (e.g., dipping or spraying) to dissolve an unexposed region and obtain a desired pattern (S4). The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., two or more times or three or more times) repeating a formation of the pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

Figure 1B:
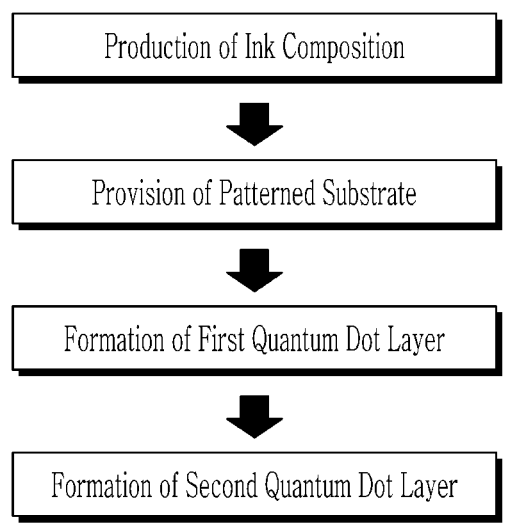
FIG. 1B schematically represents a process of producing a quantum dot composite pattern using an ink composition.

A quantum dot composite pattern may be formed by using an ink composition configured to form a pattern via an ink jet manner. Referring to FIG. 1B, the method includes preparing an ink composition; obtaining a substrate including a pattern of, for example, an electrode and optionally a pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially.

Deposition of the ink composition may be carried out using an appropriate droplet discharging system such as an ink jet printer or a nozzle printing system (e.g., having an ink reservoir and a, e.g., at least one, printer head). The deposited ink composition may be heated to remove a solvent and optionally to carry out a polymerization, and thus, provide a (first or second) quantum dot layer. The method may provide a highly precise quantum dot-polymer composite film or pattern in a relatively simple way in a relatively short period of time.

The aforementioned quantum dots or the quantum dot composite (pattern) may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dots may be included in an electronic apparatus. Such an electronic apparatus may include a portable terminal device, a monitor, a notebook personal computer (PC), a television, an electronic display, a camera, an automobile, and the like, but are not limited thereto. The electronic apparatus may be a portable terminal device including a display device (or light emitting device) including quantum dots, a monitor, a notebook PC, or a television. The electronic apparatus may be a camera or a portable terminal device including an image sensor including quantum dots. The electronic apparatus may be a camera or a vehicle including a photodetector including quantum dots.

The device (display device or light emitting device) may further include a luminescent element, e.g., light emitting element, and optionally a light source. The luminescent element may include a light emitting layer. The luminescent element may further include a substrate, and the light emitting layer may be disposed on one surface of the substrate. The light emitting layer may include a film or patterned film of the quantum dot composite. The light source may be configured to provide incident light to the luminescent element. The incident light may have a photoluminescence peak wavelength in a range of greater than or equal to about 440 nm, for example, greater than or equal to about 450 nm and less than or equal to about 500 nm, for example, less than or equal to about 480 nm, less than or equal to about 470 nm, or less than or equal to about 460 nm.

Figure 2:
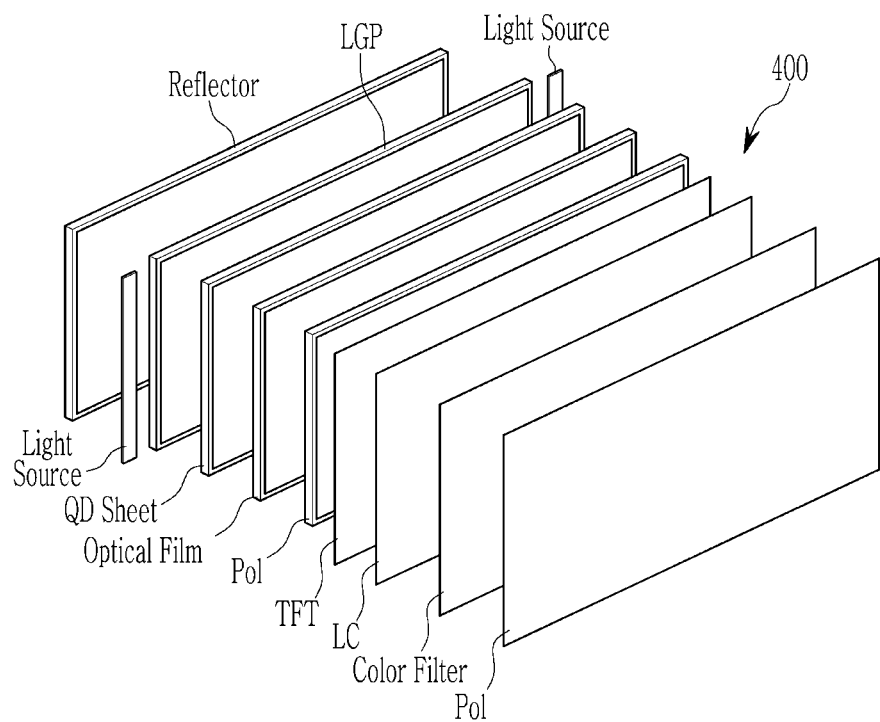
FIG. 2 is an exploded view of an embodiment of a display device.

In an embodiment, the luminescent element or the light emitting layer may include a sheet of the quantum dot composite. Referring to FIG. 2, a photoluminescence type device 400 includes a backlight unit and a liquid crystal panel, and the backlight unit may include a quantum dot polymer composite sheet (QD sheet). For example, the backlight unit may include a reflector, a light guide plate (LGP), a light source (blue LED, etc.), a quantum dot polymer composite sheet (QD sheet), and optical films (prism, dual brightness enhancement film (DBEF), etc.) and the like. The liquid crystal panel may be disposed on the backlight unit and may have a structure including a thin film transistor (TFT), liquid crystal (LC), and a color filter between two polarizers (Pol). The quantum dot polymer composite sheet (QD sheet) may include quantum dots emitting red light and quantum dots emitting green light by absorbing light from a light source. Blue light from the light source may pass through the quantum dot polymer composite sheet, being combined with red light and green light emitted from quantum dots and converted to white light. The white light may be separated to blue light, green light, and red light by a color filter in the liquid crystal panel and may be emitted to the outside in each pixel.

In an embodiment, the light emitting layer may be disposed on a front surface (e.g., a light extraction surface) of a device (light emitting device or display device) in a form of a quantum dot (or a composite thereof) patterned film. The patterned film may include a repeating section configured to emit a desired light. The repeating section may include a first section. The first section may be a red light emitting section. The repeating section may include a second section. The second section may include a green light emitting section. The repeating section may include a third section. The third section may be a section that emits or transmits blue light. Details of the first, second, and third sections are as described herein.

The light source may be an element that can provide incident light to the light emitting layer, emit excitation light, or a combination thereof. The incident or excitation light may include blue light and, optionally, green light. The light source may include an LED. The light source may include an organic LED (OLED). On the front surface (light emitting surface) of the first section and the second section, an optical element to block (e.g., reflect or absorb) blue light (and optionally green light) for example, a blue light (and optionally green light) blocking layer or a first optical filter that will be described herein may be disposed. When the light source includes organic light emitting diode to emit blue light and an organic light emitting diode to emit green light, a green light removing filter may be further disposed on a third section through which blue light is transmitted.

The light source may include a plurality of light emitting units respectively corresponding to the first section and the second section, and the light emitting units may include a first electrode and a second electrode facing each other and an (organic) electroluminescent layer between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Figure 3A:
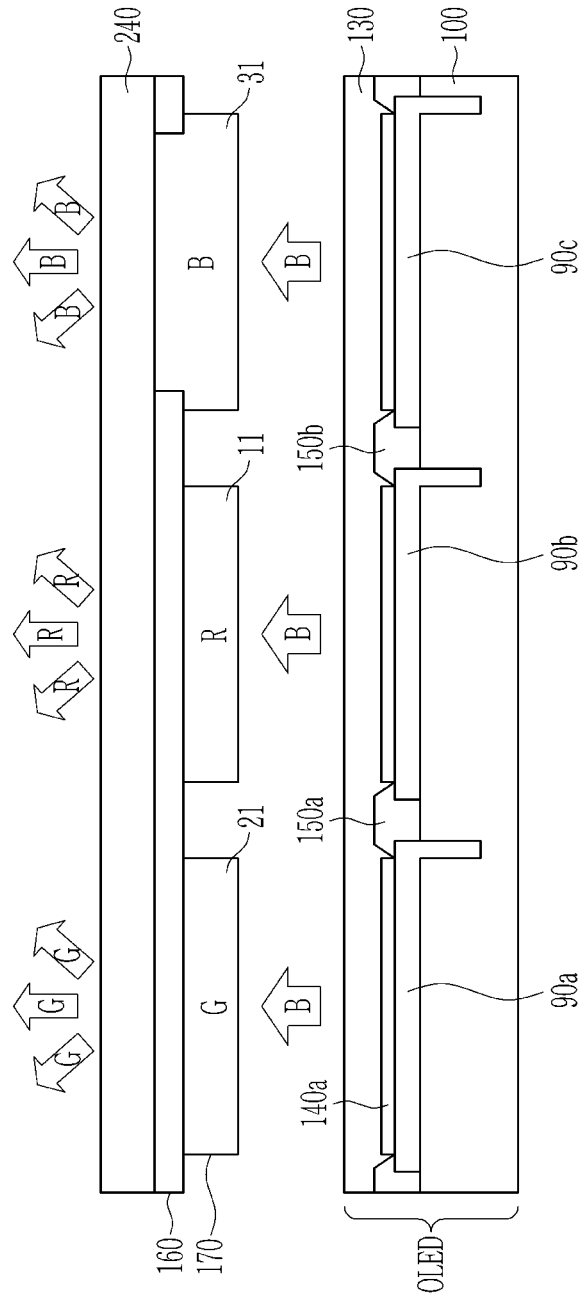
FIG. 3A is a schematic cross-sectional view of an embodiment of a display device.
Figure 3B:
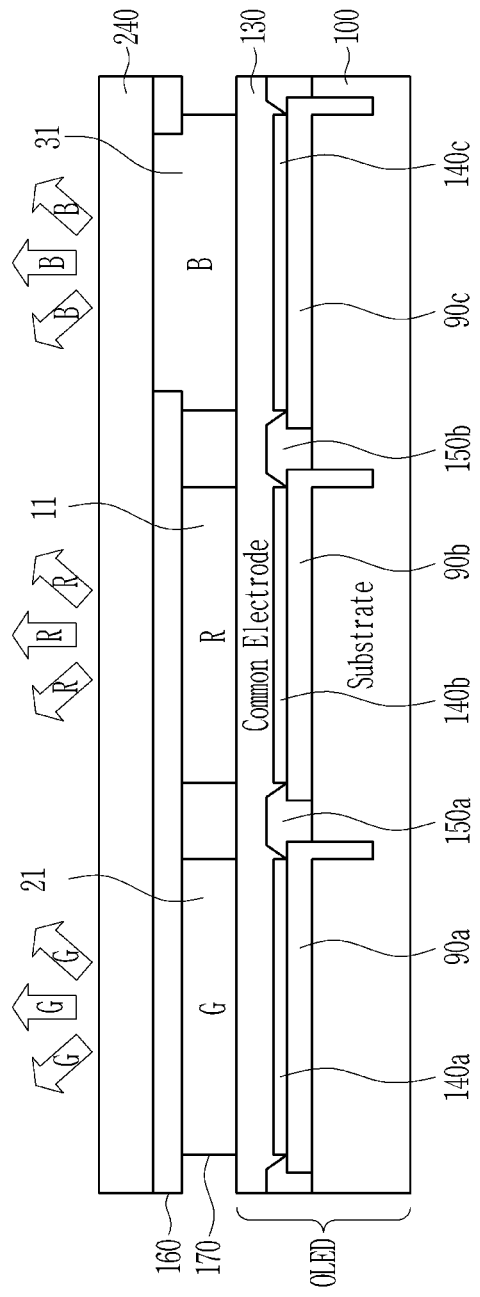
FIG. 3B is a schematic cross-sectional view of an embodiment of a display device.

FIG. 3A is a schematic cross-sectional view of a display device according to an embodiment and FIG. 3B is a schematic cross-sectional view of a display device according to an embodiment. Referring to FIGS. 3A and 3B, the light source includes an organic light emitting diode (OLED) that emits blue (B) light (and optionally green light). The organic light emitting diode (OLED) may include at least two pixel electrodes 90*a*, 90*b*, 90*c* formed on the substrate 100, a pixel defining layer 150*a*, 150*b* formed between the adjacent pixel electrodes 90*a*, 90*b*, 90*c*, an organic light emitting layer 140*a*, 140*b*, 140*c* formed on each pixel electrode 90*a*, 90*b*, 90*c*, and a common electrode layer 130 formed on the organic light emitting layer 140*a*, 140*b*, 140*c*. A thin film transistor and a substrate may be disposed under the organic light emitting diode (OLED). The pixel area of the OLED may correspond to the first, second, and third sections, respectively.

A laminated structure including the quantum dot composite pattern 170 (e.g., a first section 11 or R including red light emitting quantum dots, a second section 21 or G including green light emitting quantum dots, and a third section 31 or B including or not including a quantum dot, e.g., a blue light emitting quantum dot) and substrate 240 may be disposed on the light source. The blue light emitted from the light source enters the first section and second section and may emit red light and green light, respectively. The blue light emitted from the light source may pass through the third section. An element (first optical filter 160 or excitation light blocking layer) configured to block the excitation light may be disposed between the quantum dot composite layers R and G and the substrate, as desired. When the excitation light includes blue light and green light, a green light blocking filter may be added to the third section. The first optical filter or the excitation light blocking layer will be described in more detail herein.

Such a (display) device may be produced by separately producing the aforementioned laminated structure and LED or OLED (e.g., emitting blue light) and then combining the laminated structure and LED or OLED. The (display) device may be produced by directly forming the quantum dot composite pattern on the LED or OLED.

The substrate may be a substrate including an insulation material. The substrate may include glass; various polymers such as a polyester of polyethylene terephthalate (PET), polyethylene naphthalate (PEN), and the like, polycarbonate, and polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may vary depending on an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are laminated sequentially.

Between two adjacent pixel electrodes, a pixel defining layer (PDL) overlapped with a terminal end of the pixel electrode to divide the pixel electrode into a pixel unit. The pixel defining layer is an insulation layer which may electrically block the at least two pixel electrodes.

The pixel defining layer covers a portion of the upper surface of the pixel electrode, and the remaining region of the pixel electrode not covered by the pixel defining layer may provide an opening. An organic light emitting layer that will be described herein may be formed in the region defined by the opening.

The organic light emitting layer defines each pixel area by the aforementioned pixel electrode and the pixel defining layer. In other words, one pixel area may be defined as an area formed with one organic light emitting unit layer which is contacted with one pixel electrode divided by the pixel defining layer. In the display device according to an embodiment, the organic light emitting layer may be defined as a first pixel area, a second pixel area and a third pixel area, and each pixel area is spaced apart from each other leaving a predetermined interval by the pixel defining layer.

In an embodiment, the organic light emitting layer may emit a third light belonging to a visible light region or belonging to an ultraviolet (UV) region. Each of the first to the third pixel areas of the organic light emitting layer may emit third light. In an embodiment, the third light may be a light having the highest energy in the visible light region, for example, may be blue light (and optionally green light). When all pixel areas of the organic light emitting layer are designed to emit the same light, each pixel area of the organic light emitting layer may be all formed of the same or similar materials or may show, e.g., exhibit, the same or similar properties. Thus a process of forming the organic light emitting layer may be simplified, and the display device may be easily applied for, e.g., made by, a large scale/large area process. However, the organic light emitting layer according to an embodiment is not necessarily limited thereto, but the organic light emitting layer may be designed to emit at least two different lights, e.g., at least two different colored lights.

The organic light emitting layer includes an organic light emitting unit layer in each pixel area, and each organic light emitting unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the laminated structure and the lower substrate, and in the laminated structure, the photoluminescence layer (i.e., light emitting layer) may be disposed to face the liquid crystal layer. The display device may further include a polarizing plate between the liquid crystal layer and the light emitting layer. The light source may further include LED and if desired, a light guide plate.

Figure 4:
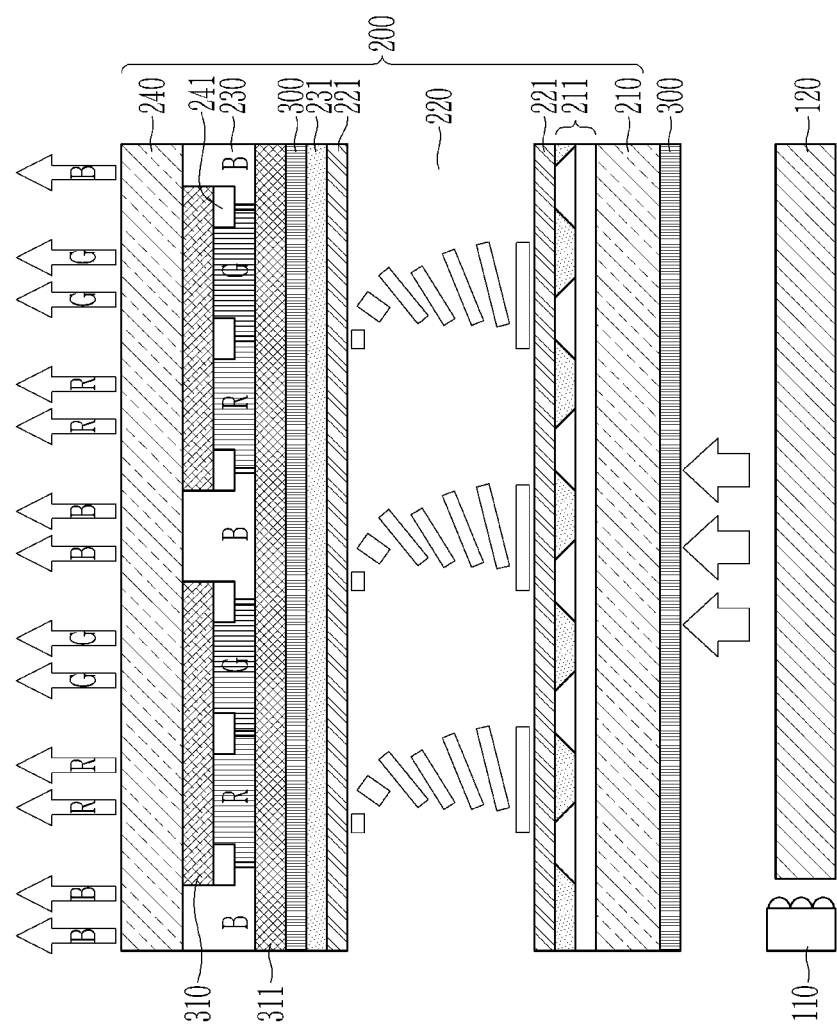
FIG. 4 is a schematic cross-sectional view of an embodiment of a display device.

Non-limiting examples of the display device (e.g., a liquid crystal display device) according to an embodiment are illustrated with a reference to a drawing. FIG. 4 is a schematic cross sectional view showing a liquid crystal display according to an embodiment. Referring to FIG. 4, the display device of an embodiment includes a liquid crystal panel 200, a polarizing plate 300 disposed under the liquid crystal panel 200, and a backlight unit disposed under the polarizing plate 300.

The liquid crystal panel 200 includes a lower substrate 210, a stack structure, and a liquid crystal layer 220 disposed between the stack structure and the lower substrate. The stack structure includes a transparent substrate 240, a first optical filter layer 310, a photoluminescent layer 230 including a pattern of a quantum dot (polymer composite) and a second optical filter layer 311.

The lower substrate 210 referred to as an array substrate may be a transparent insulation material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

A liquid crystal panel may be provided on the wire plate 211. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizing plate 300 is provided under the lower substrate 210. Materials and structures of the polarizing plate 300 are not particularly limited. A backlight unit (e.g., emitting blue light) may be disposed under the polarizing plate 300. An upper optical element or the polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any suitable polarizer that used in a liquid crystal display device. The polarizing plate may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source 110 may emit blue light or white light. The light source 110 may include a blue LED, a white LED, a white OLED, or a combination thereof, but is not limited thereto.

The backlight unit may further include a light guide plate 120. In an embodiment, the backlight unit may be an edge-type lighting. For example, the backlight unit may include a reflector (not shown), a light guide plate (not shown) provided on the reflector and providing a planar light source to the liquid crystal panel 200, a, e.g., at least one, optical sheet (not shown) on the light guide plate, for example, a diffusion plate, a prism sheet, and the like, or a combination thereof, but is not limited thereto. The backlight unit may not include a light guide plate. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, a light guide plate, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot composite pattern including a first section (R) configured to emit first light (e.g., red light), a second section (G) configured to emit second light (e.g., green light), and a third section (B) configured to emit/transmit, for example blue light. If desired, the photoluminescent layer 230 may further include a, e.g., at least one, fourth section. The fourth section may include a quantum dot that emits a light of different color from light emitted from the first to third sections (e.g., cyan, magenta, and yellow light).

In the photoluminescent layer 230, sections forming the pattern may be repeated corresponding to pixel areas formed on the lower substrate 210. A transparent common electrode 231 may be provided on the photoluminescent type color filter layer.

The third section (B) configured to emit/transmit blue light may be a transparent color filter that does not change an emission spectrum of the light source. Blue light emitted from the backlight unit may enter in a polarized state and may be emitted through the polarizing plate and the liquid crystal layer as is. If desired, the third section may include a quantum dot emitting blue light.

As described herein, if desired, the display device or light emitting device of an embodiment may further have an excitation light blocking layer or a first optical filter layer (hereinafter referred to as a first optical filter layer). The first optical filter layer may be disposed between the bottom surface of the first section (R) and the second section (G) and the substrate (e.g., the upper substrate 240) or on the upper surface of the substrate. The first optical filter layer 310 may be a sheet having an opening in a region corresponding to a pixel area (a third section) displaying blue and thus formed in a region corresponding first and second sections. The first optical filter layer may be disposed at the positions except the position overlapped with the third section and integrally therewith as shown in FIGS. 3A, 3B, and FIG. 4, but is not limited thereto. For example, at least two first optical filter layers may be disposed leaving a space at each position overlapped with the first and second sections. When the light source includes a green light emitting element, a green light blocking layer may be disposed on the third section.

The first optical filter layer may block (e.g., absorb) or substantially block light having, for example, a predetermined wavelength region in the visible light region and may transmit light in the other wavelength regions, and for example, the first optical filter layer may block blue light (or green light) and may transmit light except the blue light (or green light). The first optical filter layer may transmit, for example, green light, red light, and/or yellow light which is a mixed color thereof. The first optical filter layer may transmit blue light, block green light, and be disposed on the blue light emission pixel.

The first optical filter layer may substantially block excitation light and transmit light in a desired wavelength range. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit red light may be disposed at a position overlapped with the red light emission section, and the first optical filter layer configured to selectively transmit green light may be disposed at a position overlapped with the green light emission section. The first optical filter layer may include a first region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or a combination thereof. When the light source emits blue and green mixed light, the first optical filter may further include a third region that selectively transmits blue light and cuts or blocks green light.

The first region may be disposed at a position overlapped with the green light emitting section. The second region may be disposed at a position overlapped with the red light emitting section. The third region may be disposed at a position overlapped with the blue light emitting section.

The first region, the second region, and, optionally, the third region may be optically isolated. Such a first optical filter layer may contribute to improvement of color purity of the display device.

The display device may further include a second optical filter layer (e.g., a red/green or yellow light recycle layer) 311 disposed between the photoluminescent layer and the liquid crystal layer (e.g., the photoluminescent layer and the upper polarizing plate, e.g., polarizer), transmitting at least a portion of third light (excitation light), and reflecting a, e.g., at least one, part of the first light, part of the second light, or part of each of the first light and second light. The first light may be red light, the second light may be green light, and the third light may be blue light. For example, the second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second sections and to be emitted to the outside of the display device.

The second optical filter layer or the first optical filter layer may be formed as an integrated layer having a relatively planar surface.

The first optical filter layer may include a polymer thin film including a dye absorbing light in a wavelength which is to be blocked, a pigment absorbing light in a wavelength which is to be blocked, or a combination thereof. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. The first optical filter layer or the second optical filter layer may be formed by laminating two layers having different refractive indexes. For example, the first/second optical filter layer may be formed by alternately laminating a material having a high refractive index and a material having a low refractive index.

Figure 5A:
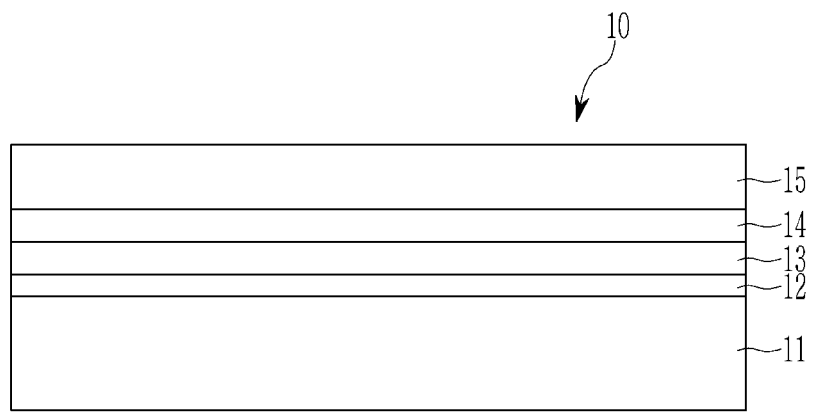
FIG. 5A is a schematic cross-sectional view of an embodiment of a light emitting device.

Referring to FIG. 5A, the electronic device 10 includes a first electrode 11 and a second electrode 15 facing each other, an active layer 13 disposed between the first electrode 11 and the second electrode 15, and including the aforementioned quantum dots.

In an embodiment, the electronic device including the quantum dots may be an electroluminescent device. The quantum dots of the active layer 13 may be a light emitting layer in which electrons and holes injected from the first electrode 11 and the second electrode 15 are recombined to form excitons, and light of a constant wavelength by the energy of the formed excitons may be emitted. Also, the electronic device including the quantum dots may be a photodetector or a solar cell. For example, the active layer 13 may be a light absorbing layer in which the quantum dots absorb external photons and separates the external photons into electrons and holes to provide electrons and holes to the first electrode 11 and the second electrode 15.

A hole auxiliary layer 12 may be disposed between the first electrode 11 and the active layer 13, and an electron auxiliary layer 14 may be disposed between the second electrode 15 and the active layer 13.

The electronic device 10 may further include a substrate (not shown). The substrate may be disposed at the side of the first electrode 11 or the second electrode 15. The substrate may be a substrate including an insulation material (e.g., an insulating transparent substrate). In addition, the substrate may include glass, various polymers such as polyester (e.g., polyethylene terephthalate (PET), polyethylene naphthalate (PEN)), polycarbonate, polyacrylate, polyimide, polyamide-imide, and the like, inorganic materials such as polysiloxane (e.g., PDMS), $Al_2O_3$, ZnO, and the like, or a combination thereof, or may be made of a silicon wafer. Herein, "transparent" may mean that transmittance through which light of a certain wavelength (e.g., light emitted from the quantum dots) passes is greater than or equal to about 85%, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material, and the like, but is not particularly limited. The transparent substrate may have flexibility.

One of the first electrode 11 and the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal such as nickel, platinum, vanadium, chromium, copper, zinc, and gold or an alloy thereof, a conductive metal oxide such as zinc oxide, indium oxide, tin oxide, indium tin oxide (ITO), indium zinc oxide (IZO), or fluorine doped tin oxide, or, or a combination of a metal and an oxide such as ZnO and Al or SnO$_2$ and Sb, but is not limited thereto. The second electrode 15 may be made of a conductor, for example a metal, a conductive metal oxide, a conductive polymer, or a combination thereof. The second electrode 15 may be for example made of a metal such as aluminum, magnesium, calcium, sodium, potassium, titanium, indium, yttrium, lithium, gadolinium, silver, gold, platinum, tin, lead, cesium, and barium or an alloy thereof, a multi-layered structure material such as LiF/Al, lithium oxide (Li$_2$O)/Al, 8-hydroxyquinolinato lithium (Liq)/Al, LiF/Ca, and BaF$_2$/Ca, but is not limited thereto. The conductive metal oxide is the same as described herein.

The work function of the first electrode 11 and the second electrode is not particularly limited, and may be appropriately selected. The work function of the first electrode 11 may be higher or lower than the work function of the second electrode 15.

The first electrode 11, the second electrode 15, or a combination thereof may be a light-transmitting electrode, and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

The thickness of the first electrode, the second electrode, or the first and second electrodes is not particularly limited, and may be appropriately selected taking into consideration device efficiency. For example, the thickness of the electrodes may be greater than or equal to about 5 nm, for example, greater than or equal to about 50 nm and less than or equal to about 100 μm, for example, less than or equal to about 10 μm, less than or equal to about 1 μm, less than or equal to about 900 nm, less than or equal to about 500 nm, or less than or equal to about 100 nm.

The active layer 13 includes the quantum dots described herein. The active layer 13 may include quantum dot layers of a monolayer or a plurality of monolayers. The plurality of monolayers may be two layers or more, three layers or more, or four layers or more and 20 layers or less, 10 layers or less, 9 layers or less, 8 layers or less, 7 layers or less, or 6 layers or less. The active layer 13 may have a thickness of greater than or equal to about 5 nm, for example, greater than or equal to about 10 nm, greater than or equal to about 20 nm, or greater than or equal to about 30 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 13 may have a thickness of about 10 nm to about 150 nm about 10 nm to about 100 nm, or about 10 nm to about 50 nm.

The electronic device 10 may further include a hole auxiliary layer 12. The hole auxiliary layer 12 is disposed between the first electrode 11 and the active layer 13. The hole auxiliary layer 12 may include a hole injection layer (HIL), a hole transport layer (HTL), an electron blocking layer (EBL), or a combination thereof. The hole auxiliary layer 12 may be a single-component layer or a multilayer structure in which adjacent layers include different components.

The highest occupied molecular orbital (HOMO) energy level of the hole auxiliary layer 12 may have a HOMO energy level that may be matched with the HOMO energy level of the active layer 13 in order to enhance mobility of holes transferred from the hole auxiliary layer 12 to the active layer 13. For example, the hole auxiliary layer 12 may include a hole injection layer close to the first electrode 11 and a hole transport layer close to the active layer 13.

Materials included in the hole auxiliary layer 12 (e.g., a hole transport layer or a hole injection layer) are not particularly limited, but may for example include poly(9,9-dioctyl-fluorene-co-N-(4-butylphenyl)-diphenylamine) (TFB), polyarylamine, poly(N-vinylcarbazole) (PVK), poly (3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., NiO, WO$_3$, MoO$_3$, etc.), a carbon-based material such as graphene oxide, or a combination thereof, but are not limited thereto.

When the electron blocking layer (EBL) is used, the electron blocking layer (EBL) may include, for example, poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly (N-vinylcarbazole) (PVK), polyaniline, polypyrrole, N,N, N',N'-tetrakis(4-methoxyphenyl)-benzidine (TPD), 4,4'-bis [N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 50 nm, for example, less than or equal to about 40 nm, less than or equal to about 35 nm, or less than or equal to about 30 nm, but is not limited thereto.

The electronic auxiliary layer 14 may be disposed between the active layer 13 and the second electrode 15. The electron auxiliary layer 14 may include, for example, an electron injection layer (EIL) that facilitates injection of electrons, an electron transport layer (ETL) that facilitates electron transport, a hole blocking layer (HBL) that blocks hole movement, or a combination thereof. For example, an electron injection layer may be disposed between the electron transport layer and the cathode. For example, the hole blocking layer (HBL) may be disposed between the active layer and the electron transport (injection) layer, but is not limited thereto. For example, the thickness of each layer may be greater than or equal to about 1 nm and less than or equal to about 500 nm, but is not limited thereto. The electron injection layer may be an organic layer formed by vapor deposition and the electron transport layer may include inorganic oxide nanoparticles.

The electron transport layer (ETL) may include, for example 1,4,5,8-naphthalene-tetracarboxylic dianhydride (NTCDA), bathocuproine (BCP), tris[3-(3-pyridyl)-mesityl] borane (3TPYMB), Li F, tris(8-hydroxyquinolinato) aluminum (Alq$_3$), tris(8-hydroxyquinolinato) gallium (Gaq$_3$), tris (8-hydroxyquinolinato) indium (Inq$_3$), bis(8-hydroxyquinolinato) zinc (Znq$_2$), bis(2-(2-hydroxyphenyl) benzothiazolate) zinc (Zn(BTZ)$_2$), bis(10-hydroxybenzo[h] quinolinato) beryllium (BeBq$_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, HfO$_2$, etc.), or a combination thereof, but is not limited thereto.

In addition, the electron transport layer (ETL) may include a plurality of nanoparticles. The nanoparticles may include metal oxides including zinc, for example, zinc oxide, zinc magnesium oxide, or a combination thereof. The metal oxide may include $Zn_{1-x}M_xO$ (wherein, M is Mg, Ca, Zr, W, Li, Ti, Y, Al, or a combination thereof and $0 \leq x \leq 0.5$). In the chemical formula, x may be greater than or equal to about 0.01 and less than or equal to about 0.3, for example, less than or equal to about 0.25, less than or equal to about 0.2, or less than or equal to about 0.15. An absolute value of lowest unoccupied molecular orbital (LUMO) of the aforementioned quantum dots included in the active layer may be smaller than an absolute value of LUMO of the metal oxide. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq3, Inq3, Znq2, Zn(BTZ)$_2$, BeBq$_2$, or a combination thereof, but is not limited thereto.

each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 5B:
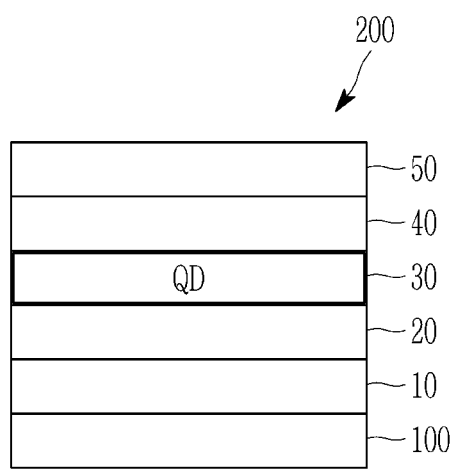
FIG. 5B is a schematic cross-sectional view of an embodiment of a light emitting device.

Referring to FIG. 5B, a device according to an embodiment may have a normal structure. An electroluminescent device 200 may include an anode 10 disposed on the transparent substrate 100 and a cathode 50 facing the anode 10. The anode 10 may include a metal oxide-based transparent electrode, and the cathode 50 facing the anode 10 may include a conductive metal having a low work function. For example, the anode may include an indium tin oxide (ITO, work function of about 4.6 electronvolts (eV) to about 5.1 eV) electrode, and the cathode 50 may include an electrode including magnesium (Mg, work function of about 3.66 eV), aluminum (Al, work function of about 4.28 eV), or a combination thereof. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10 and the hole transport layer may be disposed close to the quantum dot active layer. Also, the electron auxiliary layer 40 may be disposed between the quantum dot active layer 30 and the cathode 50. The electron auxiliary layer 40 may include an electron injection layer, an electron transport layer, or a combination thereof. The electron injection layer may be disposed close to the cathode 50 and the electron transport layer may be disposed close to the quantum dot active layer 30.

Figure 5C:
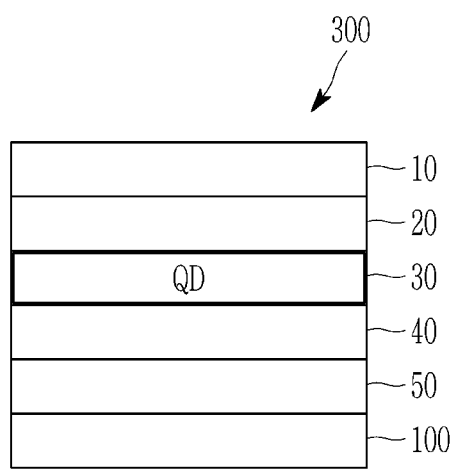
FIG. 5C is a schematic cross-sectional view of an embodiment of a light emitting device.

Referring to FIG. 5C, a device according to an embodiment may have an inverted structure. The inverted electroluminescent device 300 may include a cathode 50 disposed on the transparent substrate 100 and an anode 10 facing the cathode 50. The cathode 50 may include a metal oxide-based transparent electrode, and the anode 10 facing the cathode 50 may include a conductive metal having a high work function. For example, the cathode 50 may be an indium tin oxide (ITO, work function of about 4.6 eV to 5.1 eV) electrode, the anode 10 may be an electrode including gold (Au, work function of about 5.1 eV), silver (Ag, work function of about 4.26), aluminum (Al, work function of 4.28 eV), or a combination thereof. Also, the electronic auxiliary layer 40 may be disposed between the quantum dot active layer 30 and the cathode 50.

The electron auxiliary layer 40 may include an electron injection layer, an electron transport layer, or a combination thereof. The electron injection layer may be disposed close to the cathode 50 and the electron transport layer may be disposed close to the quantum dot active layer 30. The electron auxiliary layer 40 may include, for example, a metal oxide in the electron transport layer, such as a crystalline Zn oxide or an n-type doped metal oxide. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10, and the hole transport layer may be disposed close to the quantum dot active layer 30. The hole transport layer may include TFB, PVK, or a combination thereof, and the hole injection layer may include MoO$_3$ or other p-type metal oxides.

In the electroluminescent device, light of a certain wavelength generated in the active layer 30 is emitted to the outside through the light-transmitting electrode and the transparent substrate. For example, referring to FIG. 5B or FIG. 5C, when a metal oxide-based transparent electrode (e.g., indium tin oxide (ITO)), which is a light-transmitting electrode, is applied to the anode 10, the light formed in the active layer emitted to the outside through the anode 10 and the transparent substrate (100). Referring to FIG. 5B or FIG. 5C, when a metal oxide-based transparent electrode (e.g., indium tin oxide (ITO)), which is a light-transmitting electrode, is applied to the cathode 50, light formed in the active layer is emitted to the outside through the cathode 50 and the transparent substrate 100.

The aforementioned electronic device may be produced by a suitable method. For example, the electroluminescent device may be produced by forming a hole auxiliary layer (or an electron auxiliary layer) on a substrate on which an electrode is formed, forming an active layer including quantum dots (e.g., a pattern of the aforementioned quantum dots), and forming an electron auxiliary layer (or a hole auxiliary layer) and an electrode. The electrode, the hole auxiliary layer, and the electron auxiliary layer may each be independently formed by a suitable method, and may be formed, for example, by vapor deposition or coating, but are not particularly limited.

Hereinafter, embodiments are illustrated in more detail with reference to examples. However, they are exemplary examples of the present disclosure, and the present disclosure is not limited thereto.

EXAMPLES

Analysis Method
1. Photoluminescence Analysis

A photoluminescence (PL) spectrum of the produced quantum dots is obtained using a Hitachi F-7000 spectrophotometer.

2. Ultraviolet-Visible (UV-Vis) Spectroscopy Analysis and Measurement of Optical Density (1) UV-Vis spectroscopy analysis is performed using an Agilent Cary 5000 spectrophotometer.

(2) Optical density (an intensity (a.u.) is measured by using the UV-Vis spectrophotometer at a wavelength of about 450 nm for a dispersion prepared by the following process:

At least three time volume of ethanol is added to the crude solution as obtained after a shell formation reaction and the resulting product is subjected centrifugation and a recovered precipitate therefrom is re-dispersed in toluene or hexane. Again, at least three time volume of ethanol is added to the re-dispersed one and then the resulting product is subjected centrifugation and a recovered precipitate therefrom is dispersed again in cyclohexyl acetate (CHA) to obtain a CHA dispersion, which is then diluted with 100 times volume of CHA (1/100 diluted dispersion).

3. Inductively Coupled Plasma (ICP) Analysis

An inductively coupled plasma-atomic emission spectroscopy (ICP-AES) analysis is performed using Shimadzu ICPS-8100.

4. Blue Light Absorption and Photoconversion

Using an integration sphere, a light amount of blue light of a light source (B) is measured, and then, for a given QD composite placed in the integration sphere, the blue light (450 nm) from the light source is irradiated to the composite, and an amount of converted light (e.g., green light or red light) emitted from the composite (A) and an amount of the blue light passing through the composite (B') is measured. From the measured values, the photoconversion ratio and the blue light absorption ratio are measured as below:
Photoconversion ratio (QE)=A/B×100 (%, expressed in percentage)
Blue light absorption ratio=(B−B')/B×100 (%, expressed in percentage).

5. Thermogravimetric Analysis

A thermogravimetric analysis (TGA) is carried out by using TGA Q5000 V3.17 Build 265.

Example 1

1. Selenium and tellurium are dispersed in trioctylphosphine (TOP) to obtain a 0.4 molar (M) Se/TOP stock solution and a 0.5 M Te/TOP stock solution, respectively. Then, a mixed solution including the Te/TOP stock solution, an organic ligand including oleyl amine, and lithium aluminum hydride is prepared.

In a 300 milliliters (mL) reaction flask, 0.9 millimoles (mmol) of zinc acetate and oleic acid are dissolved in octadecene. The reaction mixture (flask) is heated under vacuum at 120° C. After one hour at 120° C., the atmosphere in the flask is replaced with an inert gas, and the reaction flask is heated to 300° C.

To the heated reaction flask, the Se/TOP stock solution and the mixed solution are injected to carry out a core formation reaction, which is completed within 10 minutes.

The reaction mixture is cooled to room temperature and then acetone is added to facilitate the forming of a precipitate, which is separated via centrifugation to provide ZnTeSe cores. The ZnTeSe cores are then dispersed in toluene.

2. Sulfur is dispersed in trioctylphosphine (TOP) to obtain a 1 molar (M) S/TOP stock solution. In a 300 mL reaction flask, zinc acetate and palmitic acid are dissolved in trioctylamine, then the mixture is heated under vacuum at 120° C. for one hour to obtain a zinc precursor. Then, an atmosphere in a flask including the zinc precursor is replaced with an inert atmosphere, the flask is heated to 250° C. or higher.

To the heated reaction system are added the prepared ZnTeSe cores and the Se/TOP stock solution to carry out a reaction for forming a ZnSe layer (about 3 monolayer (ML)) on the core. Then, to the reaction system, the S/TOP stock solution and the zinc precursor is added to carry out a reaction, forming a ZnS layer (having a thickness of about 0.1 ML confirmed by ICP-AES).

After the completion of the reaction, the reaction system is cooled to room temperature and acetone is added thereto to generate precipitation, from which the ZnTeSe/ZnSe/ZnS quantum dots are recovered via centrifugation. The obtained quantum dots are dispersed in an organic solvent (e.g., chloroform, toluene, or cyclohexyl acetate (CHA)).

For the obtained quantum dots, a photoluminescent spectroscopy analysis is carried out. It is confirmed that the quantum dots thus obtained emit green light with a full width at half maximum of less than or equal to 40 nm and a quantum yield of greater than or equal to 60%.

For a CHA dispersion of the quantum dots, a UV-Vis absorption spectroscopy analysis is carried out and the results are shown in Table 1. The size of the quantum dots is about 4.9 nm.

Figure 6:
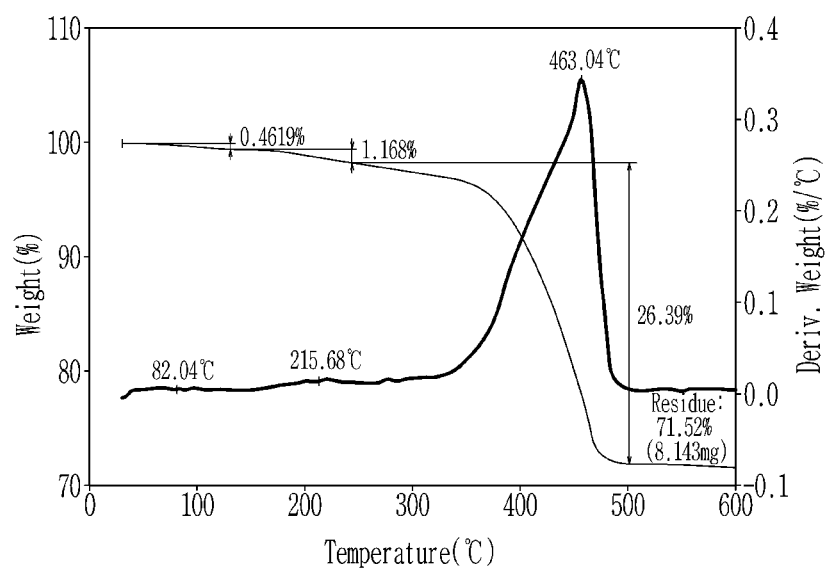
FIG. 6 is a graph of Weight (percent (%)) and Derivative (Deriv.) Weight (percent per degree Celsius (%/° C.)) versus Temperature (° C.) showing the results of a thermogravimetric analysis for the quantum dots of Example 1.

For the obtained quantum dots, a thermogravimetric analysis is carried out and the results are shown in FIG. 6. After a thermal degradation, a TGA residue of the quantum dots is about 71.5% based on a total weight of the quantum dots.

3. A chloroform solution of the prepared quantum dots is mixed with a solution of a binder polymer, which is a four membered copolymer of methacrylic acid, benzyl methacrylate, hydroxyethyl methacrylate, and styrene, (acid value: 130 milligrams (mg) of KOH per gram (mg KOH/g), molecular weight: 8,000 g/mol, acrylic acid:benzyl methacrylate:hydroxyethyl methacrylate:styrene (mole ratio) =61.5:12:16.3:10.2) (solvent:propylene glycol monomethyl ether acetate, PGMEA, a concentration of 30 percent by weight, wt %) to form a quantum dot-binder dispersion.

To the prepared quantum dot-binder dispersion, a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ fine particles having an average size of about 200 nm, and PGMEA (as a solvent) are added to obtain a composition.

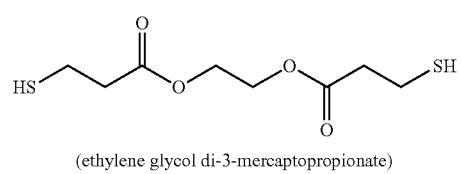

(ethylene glycol di-3-mercaptopropionate)

-continued

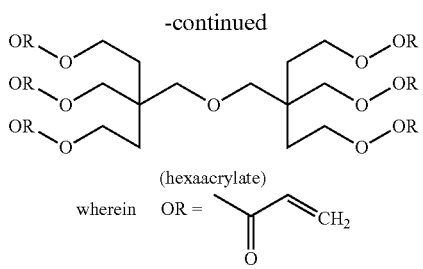

(hexaacrylate)

wherein OR = (acrylate group structure with CH₂)

Based on a total solid content, the prepared composition includes 40 wt % of quantum dots, 12.5 wt % of the binder polymer, 25 wt % of 2T, 12 wt % of the photopolymerizable monomer, 0.5 wt % of the photoinitiator, and 10 wt % of the metal oxide fine particle. The total solid content is about 25%.

The obtained composition is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 100 millijoules, mJ) under a mask having a predetermined pattern (e.g., a square dot or stripe pattern) for 1 second(s) (EXP) and developed with a potassium hydroxide aqueous solution (concentration: 0.043 weight %) for 50 seconds to obtain a pattern of a quantum dot polymer composite.

The obtained pattern is heat-treated at a temperature of 180° C. for 30 minutes under a nitrogen atmosphere (POB).

For the obtained composite film, a photoluminescent spectroscopy analysis, a UV-Vis absorption spectroscopy, and an ICP analysis are carried out and the results are shown in Table 2 and Table 3.

Example 2 and Example 3

1. Quantum dots are prepared in the same manner as Example 1, except for changing the ZnSe layer into 2 ML (for Example 2) and 1 ML (for Example 3) and adjusting an amount of the sulfur precursor to obtain a thickness of a ZnS layer as shown in Table 1. The size of the quantum dots is about 4.8 nm (for Example 2) and about 4.6 nm (for Example 3).

For the obtained quantum dots, a photoluminescent spectroscopy analysis is carried out. The quantum dots emit green light with a full width at half maximum of less than or equal to 40 nm and a quantum yield of greater than or equal to 50%.

For a CHA dispersion of the quantum dots, a UV-Vis absorption spectroscopy analysis is carried out and the results are shown in Table 1.

For the obtained quantum dots, a thermogravimetric analysis is carried out. After a thermal degradation, TGA residues of the quantum dots is about 69% (for Example 2) and 72% (for Example 3) based on a total weight of the quantum dots, respectively.

For the obtained composite film, an ICP analysis are carried out. In the quantum dot composites prepared in Example 2 and Example 3, a total amount of zinc, tellurium, selenium, sulfur, and titanium is about 37 weight percent and about 34 weight percent, based on a total weight of the composite, as determined by an inductively coupled plasma atomic emission spectroscopy.

2. Using each of the quantum dot chloroform dispersions, a quantum dot composite pattern is prepared for Example 2 and Example 3 in the same manner as set forth in Example 1. For the obtained composite film, a photoluminescent spectroscopy analysis and a UV-Vis absorption spectroscopy are carried out and the results are shown in Table 2.

Comparative Example 1

Indium acetate and palmitic acid are dissolved in 1-octadecene in a 200 milliliters (mL) reaction flask, subjected to a vacuum state at 120° C. for one hour. A mole ratio of indium to palmitic acid is 1:3. The atmosphere in the flask is exchanged with $N_2$. After the reaction flask is heated to 280° C., a mixed solution of tris(trimethylsilyl)phosphine ($TMS_3P$) and trioctylphosphine (TOP) is quickly injected, and the reaction proceeds for a predetermined time (e.g., for about 20 minutes). The reaction mixture then is rapidly cooled to room temperature and acetone is added thereto to produce nanocrystals, which are then separated by centrifugation and dispersed in toluene to obtain a toluene dispersion of the InP core nanocrystals. The amount of the $TMS_3P$ is about 0.75 moles per one mole of indium.

Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the reaction flask is replaced with $N_2$. While the resulting solution is heated to about 320° C., a toluene dispersion of the prepared InP semiconductor nanocrystal is injected thereto and the Se/TOP stock solution, the S/TOP stock solution, optionally with the zinc acetate is injected into the reaction flask over three times, and a reaction proceeds.

An excess amount of ethanol is added to the final reaction mixture including core/multi-shell quantum dots, which is then centrifuged. After centrifugation, the supernatant is discarded and the precipitate is dried and dispersed in chloroform to obtain a InP/ZnSe/ZnS quantum dot solution (hereinafter, QD solution).

For a CHA dispersion of the quantum dots, a UV-Vis absorption spectroscopy analysis is carried out and the results are shown in Table 1.

Using the quantum dot chloroform dispersion, a quantum dot composite pattern is prepared for Comparative Example 1 in the same manner as set forth in Example 1. For the obtained composite film, a photoluminescent spectroscopy analysis and a UV-Vis absorption spectroscopy are carried out and the results are shown in Table 2.

Comparative Example 2

1. Quantum dots are prepared in the same manner as Example 1, except for using octadecene as an organic solvent during the shell formation and changing the ZnSe layer into 1 ML.

For a CHA dispersion of the quantum dots, a UV-Vis absorption spectroscopy analysis is carried out and the results are shown in Table 1.

Figure 7:
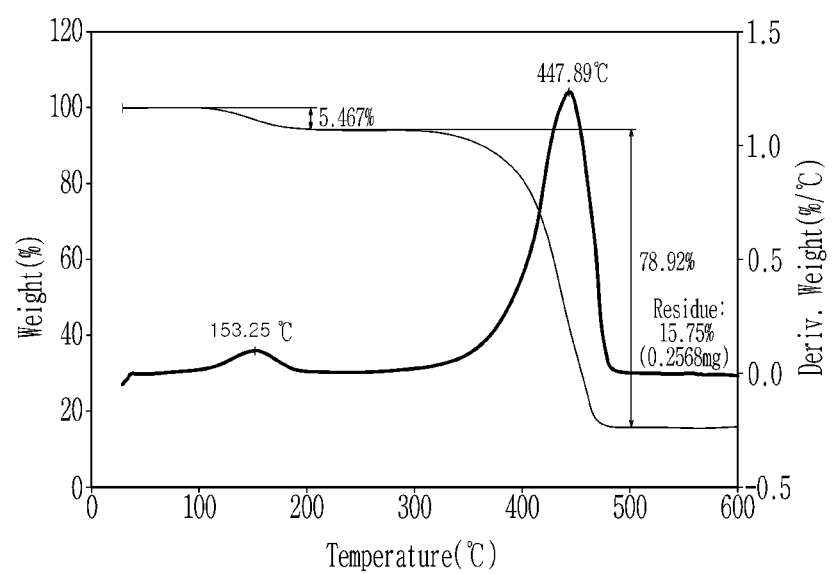
FIG. 7 is a graph of Weight (%) and Deny. Weight (%/° C.) versus Temperature (° C.) showing the results of a thermogravimetric analysis for the quantum dots of comparative Example 2.

For the obtained quantum dots, a thermogravimetric analysis is carried out and the results are shown in FIG. 7. After a thermal degradation, a TGA residue of the quantum dots is about 15.8% based on a total weight of the quantum dots.

2. Using the quantum dot chloroform dispersion, a quantum dot composite pattern is prepared in the same manner as set forth in Example 1. For the obtained composite film, a photoluminescent spectroscopy analysis, a UV-Vis absorption spectroscopy, and an ICP analysis are carried out and the results are shown in Table 2 and Table 3.

TABLE 1

| Structure | | Relative Optical Density of a 1/100 diluted 23 wt % CHA dispersion |
|---|---|---|
| ZnTeSe/ZnSe(3 ML)/ZnS(~1 ML) | Example 1 | 179% |
| ZnTeSe/ZnSe(2 ML)/ZnS(~1 ML) | Example 2 | 147% |
| ZnTeSe/ZnSe(1 ML)/ZnS(~1 ML) | Example 3 | 141.4% |
| InP/ZnSe(3 ML)/ZnS(~1 ML) | Comp. Example 1 | 106% |
| ZnTeSe/ZnSe(1 ML)/ZnS(~1 ML) | Comp. Example 2 | 100% |

The results show that the quantum dots of the examples exhibit an improved optical density.

TABLE 2

| | Film results | | | |
|---|---|---|---|---|
| | Thickness (μm) | Peak luminescent wavelength (nm) | Full Width at Half Maximum (FWHM) (nm) | Absorption ratio (in %) |
| Example 1 | 10.2 | 546 | 37 | 93.7 |
| Example 2 | 10.6 | 541 | 36 | 93.3 |
| Example 3 | 10.5 | 528 | 40 | 91.7 |
| Comp. Example 1 | 10.3 | 534 | 38 | 85.3 |
| Comp. Example 2 | 10.4 | 536 | 36 | 78.7 |

The results show that the quantum dots of the examples exhibit an improved absorption.

TABLE 3

| | Analysis results | | | | | | | | | | |
|---|---|---|---|---|---|---|---|---|---|---|---|
| | Film quantitative analysis (wt %) | | | | | Mole ratio for the inorganic substances of the composite film with respect to tellurium and a mole percent of titanium in the inorganic substances of the composite film | | | | | In QD, mole ratio |
| | Zn | Te | Se | S | Ti | Zn/Te | Te/Te | Se/Te | S/Te | Ti | S:Te |
| Example 1 | 17.7 | 5.2 | 8.9 | 6.1 | 2 | 6.63 | 1 | 2.77 | 4.69 | 6.4% | 0.55:1 |
| Comp. Example 2 | 4.99 | 1.46 | 2.77 | 3.25 | 1.36 | 6.6 | 1 | 3.046 | 8.8 | 10.6% | 0.32:1 |

Experimental Example 1

Quantum dot composites including the quantum dots of ZnTeSe/ZnSe/ZnS are prepared in the same manner as Example 1, except that an amount of tellurium with respect to titanium (weight/weight) is changed and for each of the composite, a blue light absorption is measured. The results are shown in FIG. 8 and Table 4.

TABLE 4

| Te/Ti (weight ratio, wt/wt) | Absorption ratio % |
|---|---|
| 0.15 | 53 |
| 0.22 | 54 |
| 0.39 | 62 |
| 0.81 | 78 |
| 0.86 | 72 |
| 1.76 | 86 |
| 2.39 | 92 |
| 2.44 | 92 |
| 2.78 | 93 |
| 2.89 | 94 |
| 3.01 | 92 |

Figure 8:
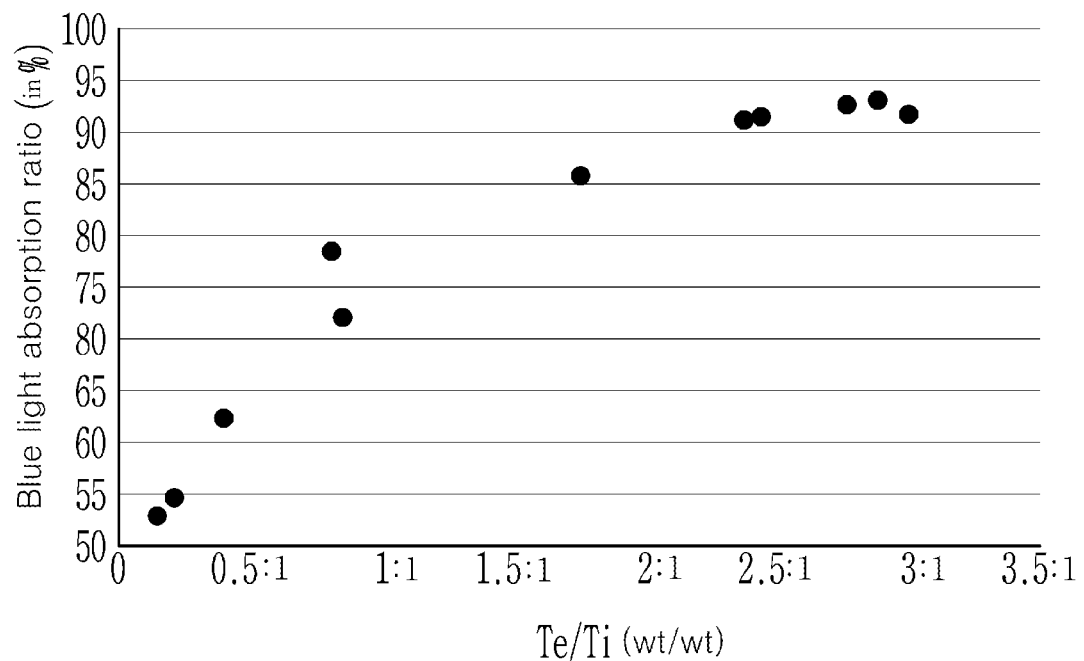
FIG. 8 is a graph of Blue light absorption ratio (expressed by "%") versus weight ratio of Te to Ti (Te:Ti) showing the changes of the blue light absorption ratio according to a weight ratio of tellurium with respect to titanium in the quantum dot composite of Experimental Example 1.

The results of FIG. 8 and Table 4 confirm that the quantum dot composite of the embodiments may show, e.g., exhibit, improved blue light absorption.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot composite comprising
   a matrix; and
   a plurality of quantum dots and titanium oxide particles dispersed in the matrix,
   wherein the quantum dots comprise zinc, selenium, and tellurium,
   wherein the quantum dots do not comprise cadmium,
   wherein the quantum dot composite exhibits a blue light absorption of greater than or equal to about 85%, and
   wherein in the quantum dot composite, a weight ratio of tellurium with respect to titanium is greater than or equal to about 1.5:1 and less than or equal to about 3.01:1.

2. The quantum dot composite of claim 1, wherein the matrix comprises an organic solvent, a polymerizable monomer, a crosslinked polymer, a linear polymer, or a combination thereof.

3. The quantum dot composite of claim 1, wherein the quantum dots and the titanium oxide particle are intermixed in the matrix.

4. The quantum dot composite of claim 1, wherein in the quantum dot composite, a weight ratio of zinc with respect to titanium is greater than or equal to about 4:1 and less than or equal to about 11.4:1.

5. The quantum dot composite of claim 1, wherein in the quantum dot composite, a mole ratio of tellurium with respect to selenium is greater than or equal to about 0.35:1.

6. The quantum dot composite of claim 1, wherein the quantum dot composite does not comprise an indium phosphide, an indium zinc phosphide, or a combination thereof.

7. The quantum dot composite of claim 1, wherein the quantum dots comprise a first semiconductor nanocrystal comprising zinc, selenium, and tellurium, and a zinc chalcogenide different from the first semiconductor nanocrystal and comprising selenium, sulfur, or a combination thereof.

8. The quantum dot composite of claim 1, wherein in the quantum dot composite, a total amount of zinc, tellurium, selenium, sulfur, and titanium is greater than or equal to about 30 weight percent, based on a total weight of the composite, as determined by an inductively coupled plasma atomic emission spectroscopy.

9. The quantum dot composite of claim 1, wherein in the quantum dot composite, an amount of tellurium is greater than or equal to about 1.5 weight percent, based on a total weight of the composite.

10. The quantum dot composite of claim 1, wherein the titanium metal oxide particles have an average particle size of greater than or equal to about 100 nanometers and less than or equal to about 500 nanometers.

11. The quantum dot composite of claim 1, wherein in the quantum dot composite, an amount of titanium is greater than or equal to about 1 weight percent, based on a total weight of the quantum dot composite.

12. The quantum dot composite of claim 1, wherein the quantum dot composite is configured to emit green light having a maximum luminescent peak with a full width at half maximum of less than or equal to about 40 nanometers.

13. The quantum dot composite of claim 1, wherein the quantum dot composite has an absorption ratio with respect to blue light of greater than or equal to about 88%.

14. A display device comprising
a light emitting element, and optionally a light source,
wherein the light emitting element comprises the quantum dot composite of claim 1.

15. An electronic device comprising
a first electrode and a second electrode each having a surface opposite the other; and
an active layer comprising the quantum dot composite of claim 1 disposed between the first and the second electrodes.

16. A method of preparing the quantum dot composite of claim 1, the method comprising
combining quantum dots comprising zinc, selenium, and tellurium, a dispersing agent, a nd a solvent to prepare a quantum dot dispersion;
mixing the quantum dot dispersion with titanium oxide particles, a photoinitiator, and a polymerizable monomer to form a composition; and
exposing the composition to light to polymerize the polymerizable monomer, form the matrix comprising the quantum dots and titanium oxide particles, and prepare the quantum dot composite.

17. A quantum dot composite comprising
a matrix; and
quantum dots and titanium oxide particles dispersed in the matrix,
wherein the quantum dots comprise zinc, tellurium, and selenium,
wherein the quantum dots do not comprise cadmium, lead, mercury, or a combination thereof,
wherein in the quantum dots, a mole ratio of tellurium with respect to selenium is greater than or equal to about 0.15:1,
wherein the quantum dots are configured to emit green light,
wherein in a thermogravimetric analysis, the quantum dots show a remaining mass of greater than or equal to about 60 weight percent at a temperature of greater than or equal to about 500° C. and less than or equal to about 600° C., based on a total weight of the quantum dots,
wherein the quantum dot composite exhibits a blue light absorption of greater than or equal to about 85%, and
wherein in the quantum dot composite, a weight ratio of tellurium with respect to titanium is greater than or equal to about 1.5:1 and less than or equal to about 3.01:1.

18. The quantum dot composite of claim 17, wherein the quantum dots exhibit a 5% weight loss temperature of greater than or equal to about 300° C.

19. The quantum dot composite of claim 17, wherein the quantum dots comprise an organic ligand, and the organic ligand comprises RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, RHPOOH, R$_2$POOH, a polymeric organic ligand, or a combination thereof wherein R and R' are the same or different, and are independently a substituted or unsubstituted C1 to C40 aliphatic hydrocarbon group or a substituted or unsubstituted C6 to C40 aromatic hydrocarbon group, or a combination thereof.

20. The quantum dot composite of claim 17, wherein a maximum luminescent peak wavelength of the green light or the quantum dots is greater than or equal to about 525 nanometers.

21. The quantum dot composite of claim 17, wherein the quantum dots show a full width at half maximum of less than or equal to about 40 nanometers and a quantum yield of greater than or equal to about 50%.

* * * * *